(12) United States Patent
Chhabra et al.

(10) Patent No.: US 12,052,860 B2
(45) Date of Patent: Jul. 30, 2024

(54) MEMORY ARCHITECTURE

(71) Applicant: Arm Limited, Cambridge (GB)

(72) Inventors: Amit Chhabra, Noida (IN); David Victor Pietromonaco, Cupertino, CA (US)

(73) Assignee: Arm Limited, Cambridge (GB)

( * ) Notice: Subject to any disclaimer, the term of this patent is extended or adjusted under 35 U.S.C. 154(b) by 138 days.

(21) Appl. No.: 17/149,138

(22) Filed: Jan. 14, 2021

(65) Prior Publication Data
US 2022/0223610 A1    Jul. 14, 2022

(51) Int. Cl.
| | |
|---|---|
| *H01L 27/092* | (2006.01) |
| *G11C 7/06* | (2006.01) |
| *G11C 7/10* | (2006.01) |
| *H01L 29/06* | (2006.01) |
| *H01L 29/423* | (2006.01) |
| *H01L 29/786* | (2006.01) |
| *H10B 20/00* | (2023.01) |

(52) U.S. Cl.
CPC ............. *H10B 20/60* (2023.02); *G11C 7/065* (2013.01); *G11C 7/1069* (2013.01); *G11C 7/1096* (2013.01); *H01L 27/0922* (2013.01); *H01L 29/0673* (2013.01); *H01L 29/42392* (2013.01); *H01L 29/78696* (2013.01)

(58) Field of Classification Search
CPC .......... H01L 27/11286; H01L 27/0922; H01L 29/0673; H01L 29/42392; H01L 29/78696; H01L 29/785; H01L 27/088; H01L 27/0207; H01L 27/105; G11C 7/065; G11C 7/1069; G11C 7/1096; G11C 2207/063; G11C 7/062; G11C 7/067; G11C 7/1048; G11C 7/12; G11C 8/10
USPC ....................................................... 257/351
See application file for complete search history.

(56) References Cited

U.S. PATENT DOCUMENTS

2020/0075592 A1\*  3/2020  Liebmann ......... H01L 21/76895
2020/0411518 A1\*  12/2020  Fulford ........... H01L 21/823821

\* cited by examiner

*Primary Examiner* — Tong-Ho Kim
(74) *Attorney, Agent, or Firm* — Pramudji Law Group PLLC; Ari Pramudji

(57) ABSTRACT

Various implementations described herein relate to a device with a multi-transistor logic structure for use in memory architecture. In some applications, the multi-transistor logic structure may have a pair of P-type transistors that are arranged in a P-over-P multi-transistor stack. In other applications, the multi-transistor logic structure may have a pair of N-type transistors that are arranged in an N-over-N multi-transistor stack.

20 Claims, 16 Drawing Sheets

700D
PPPP Multi-Device Stack Common-Gate Architecture 704D

600A

P-over-N Multi-Device Stack Common-Gate Architecture 604A

600B

P-over-N Multi-Device Stack Split-Gate Architecture 604B

600C

N-over-P Multi-Device Stack Common-Gate Architecture 604C

600D

N-over-P Multi-Device Stack Split-Gate Architecture 604BD

600E

N-over-N Multi-Device Stack Common-Gate Architecture 604E

600F

N-over-N Multi-Device Stack Split-Gate Architecture 604F

600G

P-over-P Multi-Device Stack Common-Gate Architecture 604G

600H

P-over-P Multi-Device Stack Split-Gate Architecture 604H

700A

PNNP Multi-Device Stack Common-Gate Architecture 704A

700C

NNNN Multi-Device Stack Common-Gate Architecture 704C

700D

PPPP Multi-Device Stack Common-Gate Architecture 704D

MEMORY ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit architecture, conventional transistor based devices use traditional layout techniques and thus suffer from low density design application that may typically cause unintended consequences in fabrication processes. Therefore, traditional layout techniques can be inefficient, density deficient and typically fail to provide sufficient means for implementing various different layout configurations. Thus, there exists a need to improve traditional layout techniques that allow for efficient device fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
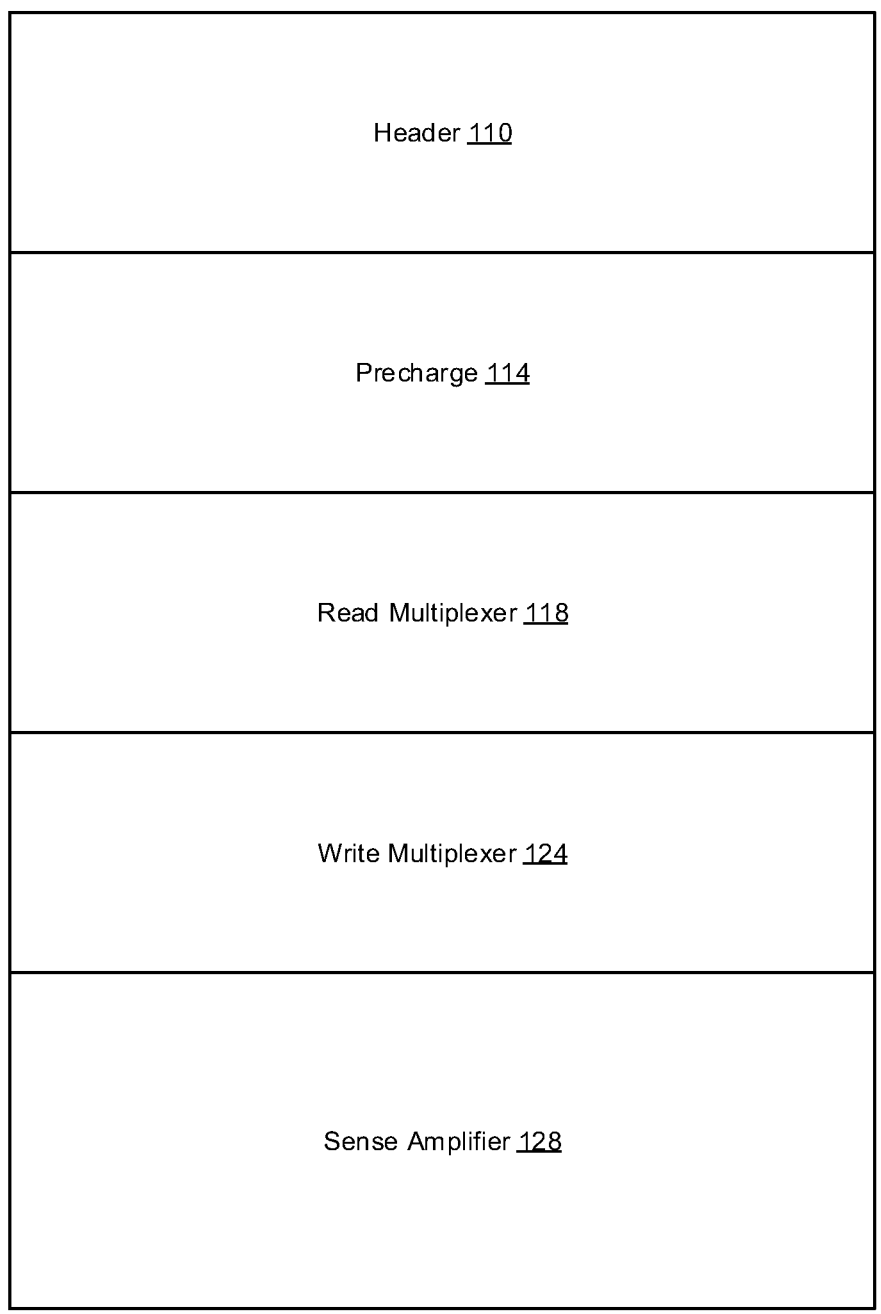
FIG. 1 illustrates a schematic diagram of memory architecture in accordance with various implementations described herein.

Various implementations described herein are directed to fabrication schemes and techniques for multi-transistor stack architectures in various physical layout designs for multi-device applications. For instance, various fabrication schemes and techniques described herein provide for various hybrid device stacking techniques for complimentary field effect transistor (FET) technologies, and therefore, aspects of the present disclosure are associated with a novel device stack architecture arrangement for complimentary FET (CFET) technologies and related applications. Also, the various fabrication schemes and techniques described herein provide a method of manufacture using hybrid technologies where multiple device stacks are fabricated together in a single monolithic semiconductor die. For instance, in some applications, N-over-P stacked devices and P-over-N stacked devices may be co-manufactured on a single wafer, and also, N-over-N stacked devices and P-over-P stacked devices refer to variants that may be simultaneously manufactured along with the N-over-P stacked devices and/or P-over-N stacked devices in the same, single monolithic semiconductor die or wafer.

In some implementations, multi-transistor fabrication schemes and techniques described herein use novel technology that supports complimentary FET (CFET) devices, wherein each device is fabricated with nano-sheets (NS) or Fin-FET(FF) that are used to form multiple devices in multi-transistor stacks within a single monolithic semiconductor die with the multiple device stacked on top of each other. The various fabrication schemes and techniques described herein provide for multiple complimentary stack configurations, such as, e.g., an NN based structure having an N-over-N stack configuration and a PP based structure having a P-over-P stack configuration. In various instances, the gates for PFET devices and NFET devices may utilize common-gate and/or split-gate architecture in the multi-device stack configurations. Further, the multi-transistor fabrication schemes and techniques described herein also utilize technology that supports N-over-P devices along with P-over-N devices as additional stack configurations that may be fabricated with the N-over-N and P-over-P stack configurations within a single monolithic semiconductor die in various multi-transistor stack applications.

In some implementations, the various multi-transistor fabrication schemes and techniques described herein may provide for other types of multiple complimentary stack configurations, such as, e.g., an NNNN based structure having an N-over-N-over-N-over-N stack configuration and a PPPP based structure having a P-over-P-over-P-over-P stack configuration. In various instances, the gates for PFET devices and NFET devices may utilize common-gate and/or split-gate architecture in the other types of multi-device stack configurations. Moreover, the multi-transistor fabrication schemes and techniques described herein also utilize technology that supports N-over-P-over-P-over-N devices along with P-over-N-over-N-over-P devices as in the same vertical stack configurations that may be fabricated with the N-over-N-over-N-over-N and P-over-P-over-P-over-P stack configurations within the same single monolithic semiconductor die in various multi-transistor stack applications. Other supported multi-transistor structures may include P-over-P-over-N-over-N, N-over-N-over-P-over-P, P-over-N-over-P-over-N, and N-over-P-over-N-over-P stack configurations.

In some implementations, the various multi-transistor fabrication schemes and techniques described herein may provide for other types of multiple stack configurations, such as, e.g., an N-only stack and/or a P-only stack For instance, as described herein, a precharge circuit may be formed with a P-only stack, wherein the P-only stack may include multiple transistors, such as, e.g., 2 or 3 or 4 or more transistors that may be built on top of each other in a multi-transistor stack structure. Various other circuits associated with memory architecture may have similar P-only/N-only stack configurations.

Various implementations of providing multi-transistor fabrication schemes and techniques will be described herein with FIGS. 1-4, 5A-5B, 6A-6H and 7A-7F.

FIG. 1 illustrates a diagram 100 of memory architecture 104 in accordance with various implementations described herein.

In some implementations, the memory architecture 104 may be implemented as a system or device having various integrated circuit (IC) components that are arranged and coupled together as an assemblage or combination of parts that provide for physical circuit designs and various related structures. In some instances, a method of designing, providing and building the memory architecture 104 as an integrated system or device may involve use of various IC circuit components described herein so as to implement fabrication schemes and techniques associated therewith. Also, the memory architecture 104 may be integrated with computing circuitry and related components on a single chip, and the memory architecture 104 may be implemented in various embedded systems for automotive, electronic, mobile, server and Internet-of-things (IoT) applications.

Figure 3:
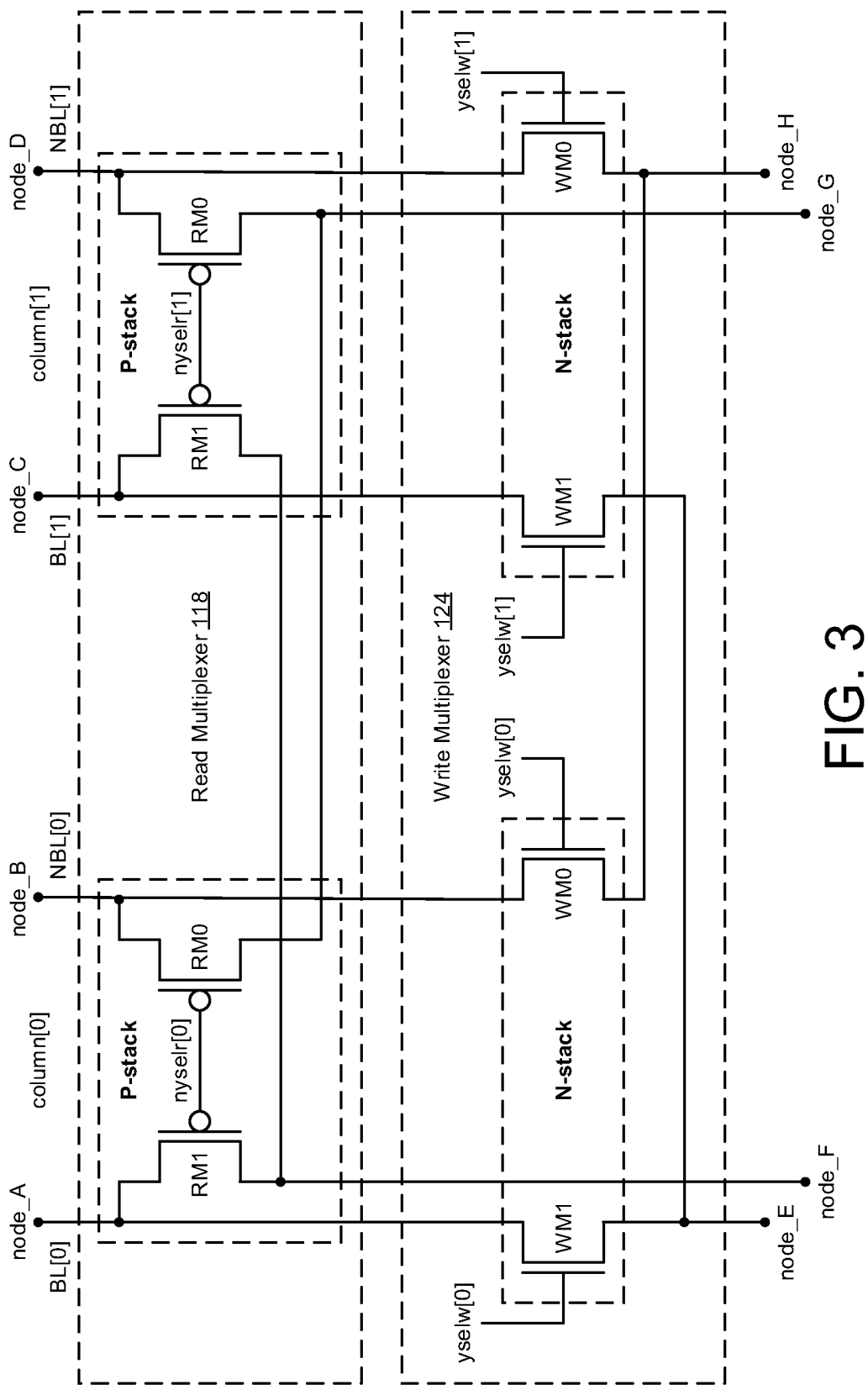
FIG. 3 illustrates a schematic diagram of read mux and write mux architecture in accordance with various implementations described herein.
Figure 4:
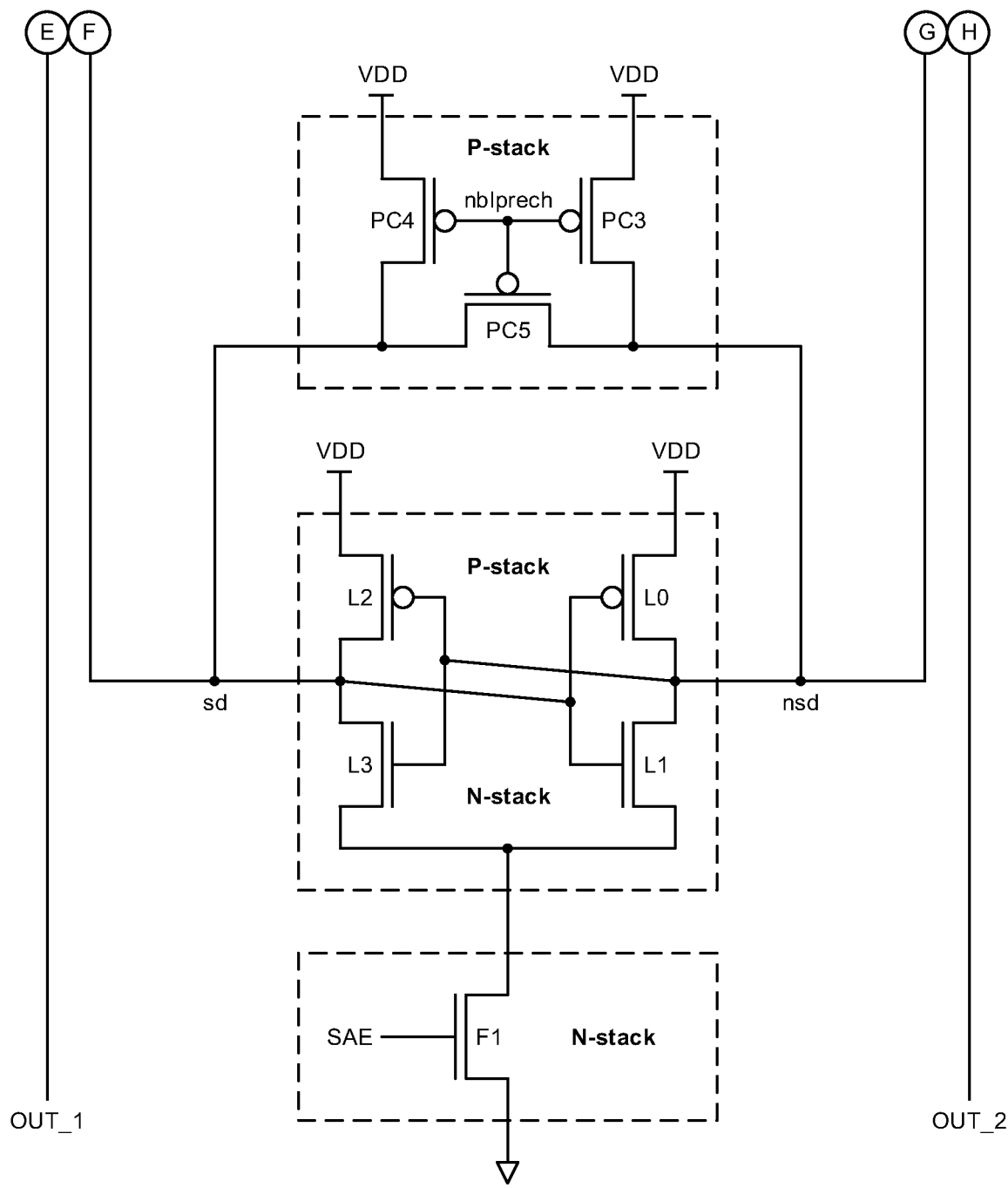
FIG. 4 illustrates a schematic diagram of sense amplifier architecture in accordance with various implementations described herein.

As shown in FIG. 1, the memory architecture 104 may have various circuit components, such as, e.g., header circuitry 110, precharge circuitry 114, read multiplexer (read mux) circuitry 118, write multiplexer (write mux) circuitry 124, and sense amplifier (sense amp) circuitry 128 that are coupled together and arranged to provide support for storing data in memory devices, such as, e.g., random access memory (RAM). In various implementations, the circuit components may refer to transistor-based logic circuits that are configured to provide the various features, behaviors and characteristics associated with read and/or write operations for data storage and accessing data stored in memory devices. These transistor-based logic circuits refer to header circuitry 110 and precharge circuitry 114 as shown in FIG. 2, read mux circuitry 118 and write mux circuitry 124 as shown in FIG. 3, and sense amp circuitry 128 as shown in FIG. 4.

Figure 2:
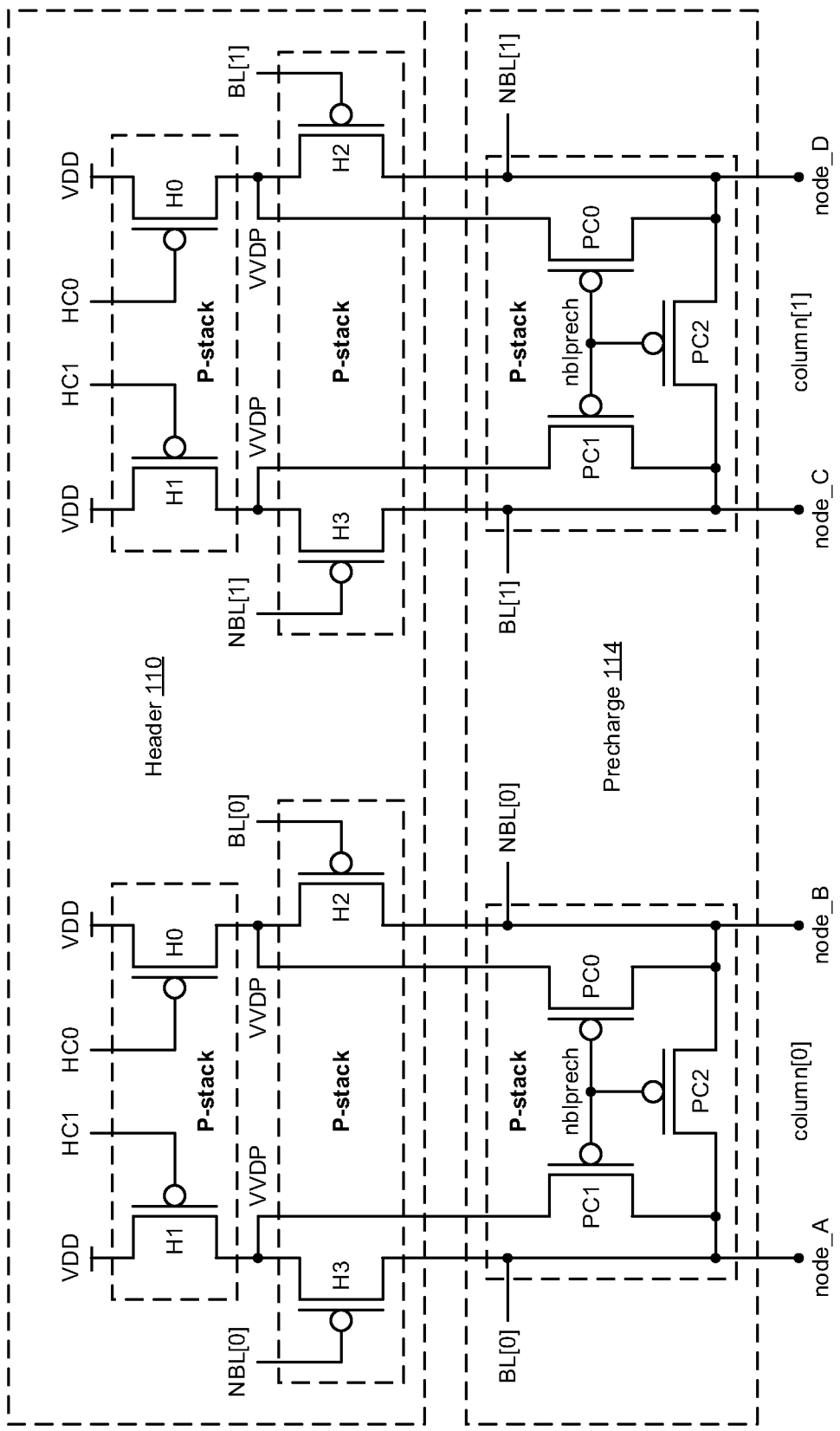
FIG. 2 illustrates a schematic diagram of header and precharge architecture in accordance with various implementations described herein.

FIG. 2 illustrates a diagram 200 of header and precharge architecture 204 in accordance with various implementations described herein.

As shown in FIG. 2, the header circuitry 110 and the precharge circuitry 114 may be coupled together via bitlines (BL, NBL), wherein a first column[0] has first bitlines (BL[0], NBL[0]) and a second column [1] has second bitlines (BL[1], NBL[1]). The header circuitry 110 includes multiple sets of transistors (H0, H1, H2, H3) coupled together and arranged in each column [0], [1]. Also, the precharge circuitry 114 includes multiple sets of transistors (PC0, PC1, PC2) coupled together and arranged in each column [0], [1].

In some implementations, the header circuitry 110 includes transistors (H0, H1) coupled between voltage supply (VDD) and transistors (H2, H3), wherein transistor (H2) is coupled between transistor (H0) and bitline (NBL), and also, transistor (H3) is coupled between transistor (H1) and bitline (BL). Transistor (H0) may be activated/enabled with a first header control signal (HC0), and transistor (H1) may be activated/enabled with a second header control signal (HC1). Transistor (H2) may be activated/enabled with bitline signal (BL), and transistor (H3) may be activated/enabled with bitline signal (NBL).

In some instances, transistors (H0, H1, H2, H3) may refer to P-type transistors that may be formed in a single multi-transistor structure, such as, e.g., a 2-transistor (2T) structure or a 4-transistor (4T) structure. In reference to the 2T structure, transistors (H0, H1) may be formed in a first 2T structure, and transistors (H2, H3) may be formed in a second 2T structure. In another implementation, transistors (H0, H1, H2, H3) may be formed each using an independent 2-transistor (2T) P-type structure. In reference to the 4T structure, transistors (H0, H1, H2, H3) may be formed in a single 4T structure. In another implementation, transistors (H0, H1, H2, H3) may be formed each using an independent 4-transistor (4T) P-type structure. In reference to columns [0], [1], the entire header 110 may be formed with an 8-transistor (8T) structure, e.g., using two 4T structures. Further, the 2T P-type structure may be formed with a P-over-P multi-transistor stack structure, and the 4T P-type structure may be formed with a P-over-P-over-P-over-P multi-transistor stack structure. These multi-transistor stack structures are described in greater detail herein in reference to FIGS. 6A-6H and 7A-7F.

In some instances, one or more of the P-type transistors (H0, H1, H2, H3) may be implemented as a P-over-P multi-device stack, which may be used to increase strength of the device. For instance, transistor (H0) may be formed with two P-type transistors that are arranged in a two device stack with a common-gate (or single gate). Moreover, in this instance, the common-gate may be used to activate both P-type transistors at the same time, which effectively doubles the strength of the P-over-P multi-device stack. In other instances, three transistors in a single stack with a common-gate may be used to increase strength of the device by a factor of three (e.g., triple strength). Also, in other instances, four transistors in a single stack with a common-gate may be used to increase strength of the device by a factor of four (e.g., quadruple strength). This concept may be applied to any single P-type transistor shown in FIGS. 2-4 and 5A-5B.

In some implementations, the precharge circuitry 114 includes transistors (PC0, PC1) coupled between internal node VVDP and transistor (PC2), wherein transistor (PC0) is coupled in parallel with transistor (H2) to bitline (NBL), and transistor (PC1) is coupled in parallel with transistor (H3) to bitline (BL). Transistor (PC2) may be coupled between bitlines (BL, NBL), and also, transistors (PC0, PC1, PC2) may be activated/enabled with a precharge control signal (nblprech).

In some instances, transistors (PC0, PC1, PC2) may refer to P-type transistors that may be formed in a single multi-transistor structure, such as, e.g., a 2-transistor (2T) structure or a 4-transistor (4T) structure. In reference to the 2T structure, transistors (PC0, PC1) may be formed in a first 2T structure, and also, transistor (PC2) may be formed in a second 2T structure, wherein only one of the 2T transistors may be used. In some instances, each of transistors (PC0, PC1, PC2) may have an independent 2-transistor (2T) P-type structure. In reference to the 4T structure, transistors (PC0, PC1, PC2) may be formed in a single 4T structure, wherein only three of the 4T transistors may be used. In other instances, each of transistors (PC0, PC1, PC2) may have an independent 4-transistor (4T) P-type structure. In reference to columns [0], [1], the entire precharge 114 may be formed with an 8-transistor (8T) structure, e.g., using two 4T structures, wherein only six of the 8T transistors is used. The 2T P-type structure may be formed with a P-over-P multi-transistor stack structure, and the 4T P-type structure may be formed with a P-over-P-over-P-over-P multi-transistor stack structure. These multi-transistor stack structures are described in greater detail herein in reference to FIGS. 6A-6H and 7A-7F.

FIG. 3 illustrates a diagram 300 of read mux and write mux architecture 304 in accordance with various implementations described herein.

As shown in FIG. 3, the read mux circuitry 118 and the write mux circuitry 124 may be coupled together via bitlines (BL, NBL), wherein the first column[0] has the bitlines (BL[0], NBL[0]) and the second column [1] has the bitlines (BL[1], NBL[1]). The read mux circuitry 118 has multiple sets of transistors (RM0, RM1) coupled together and arranged in each column [0], [1]. Also, the write mux circuitry 124 has multiple sets of transistors (WM0, WM1) coupled together and arranged in each column [0], [1].

In some implementations, the read mux circuitry 118 includes transistors (RM0, RM1) cross-coupled to bitlines (BL, NBL), wherein transistors (RM0) are coupled between nodes B/D and node G, and wherein transistors (RM1) are coupled between nodes A/C and node F. Transistors (RM0, RM1) in the first column [0] may be activated/enabled with a first read selection signal (nyselr[0]), and transistors (RM0, RM1) in the second column [1] may be activated/enabled with a second read selection signal (nyselr[1]).

In some instances, transistors (RM0, RM1) may refer to P-type transistors that are formed in a single multi-transistor structure, such as, e.g., a 2-transistor (2T) structure or a 4-transistor (4T) structure. In reference to the 2T structure, transistors (RM0, RM1) in the first column [0] may be formed in a first 2T structure, and transistors (RM0, RM1) in the second column [1] may be formed in a second 2T structure. In some instances, each of transistors (RM0, RM1) may have an independent 2-transistor (2T) P-type structure. In reference to the 4T structure, transistors (RM0, RM1) for both column [0], [1] may be formed in a single 4T structure. In other instances, each of transistors (RM0, RM1) may have an independent 4-transistor (4T) P-type structure. In reference to columns [0], [1], the entire read mux 118 may be formed with a 4-transistor (4T) structure, e.g., using a single 4T structure. Further, the 2T P-type structure may be formed with a P-over-P multi-transistor stack structure, and also, the 4T P-type structure may be formed with a P-over-P-over-P-over-P multi-transistor stack structure. These multi-transistor stack structures are described in greater detail herein in reference to FIGS. 6A-6H and 7A-7F.

In some implementations, the write mux circuitry 124 may include transistors (WM0, WM1) cross-coupled to bitlines (BL, NBL), wherein transistors (WM0) are coupled between nodes B/D and node H, and wherein transistors (WM1) are coupled between nodes NC and node E. In some instances, transistors (WM0, WM1) in the first column [0] may be activated/enabled with a first write selection signal (yselw[0]), and transistors (WM0, WM1) in the second column [1] may be activated/enabled with a second write selection signal (yselw[1]).

In some instances, transistors (WM0, WM1) may refer to N-type transistors that are formed in a single multi-transistor structure, such as, e.g., a 2-transistor (2T) structure or a 4-transistor (4T) structure. In reference to the 2T structure, transistors (WM0, WM1) in the first column [0] may be formed in a first 2T structure, and transistors (WM0, WM1) in the second column [1] may be formed in a second 2T structure. In some instances, each of transistors (WM0, WM1) may have an independent 2-transistor (2T) N-type structure. In reference to the 4T structure, transistors (WM0, WM1) for both column [0], [1] may be formed in a single 4T structure. In other instances, each of transistors (WM0, WM1) has an independent 4-transistor (4T) N-type structure. In reference to columns [0], [1], the entire write mux 124 may be formed with a 4-transistor (4T) structure, e.g., using a single 4T structure. Also, the 2T N-type structure may be formed with a P-over-P multi-transistor stack structure, and also, the 4T N-type structure may be formed with a P-over-P-over-P-over-P multi-transistor stack structure. These multi-transistor stack structures are described in greater detail herein in reference to FIGS. 6A-6H and 7A-7F.

In some instances, one or more of the N-type transistors (WM0, WM1) may be implemented as a N-over-N multi-device stack, which may be used to increase strength of the device. For instance, transistor (WM0) may be formed with two N-type transistors that are arranged in a two device stack with a common-gate (or single gate). Also, in this instance, the common-gate may be used to activate both N-type transistors at the same time, which effectively doubles the strength of the N-over-N multi-device stack. In other instances, three transistors in a single stack with a common-gate may be used to increase strength of the device by a factor of three (e.g., triple strength). Also, in other instances, four transistors in a single stack with a common-gate may be used to increase strength of the device by a factor of four (e.g., quadruple strength). This concept may be applied to any single N-type transistor shown in FIGS. 2-4 and 5A-5B.

FIG. 4 illustrates a schematic diagram 400 of sense amplifier architecture 404 in accordance with various implementations described herein.

In various implementations, the sense amplifier architecture 404 may include precharge transistors including transistors (PC3, PC4, PC5) coupled to nodes F/G via nodes sd/nsd. For instance, transistors (PC3, PC4) may be coupled between the voltage supply (VDD) and nodes F/G via nodes sd/nsd, and transistors (WM1) may be coupled between nodes NC and node E. Also, transistor (PC5) may be coupled between nodes sd/nsd. In some instances, transistors (PC3, PC4, PC5) may be activated/enabled with another precharge signal (nblprech).

In some instances, transistors (PC3, PC4, PC5) may refer to P-type transistors that are formed in a single multi-transistor structure, such as, e.g., a 2-transistor (2T) structure or a 4-transistor (4T) structure. In reference to the 2T structure, transistors (PC3, PC4) may be formed in a first 2T structure, and transistor (PC5) may be formed in a second 2T structure, wherein only one of the 2T transistors may be used. In some instances, each of transistors (PC3, PC4, PC4) may have an independent 2-transistor (2T) P-type structure. In reference to the 4T structure, transistors (PC3, PC4, PC5) may be formed in a single 4T structure, wherein only three of the 4T transistors may be used. In other instances, each of transistors (PC3, PC4, PC4) may have an independent 4-transistor (4T) P-type structure. As such, the precharge transistors (PC3, PC4, PC5) may be formed with a 4-transistor (4T) structure, e.g., using a single 4T structure, wherein only three of the 4T transistors may be used. The 2T N-type structure may be formed with a N-over-N multi-transistor stack structure, and also, the 4T N-type structure may be formed with a N-over-N-over-N-over-N multi-transistor stack structure. These multi-transistor stack structures are described in greater detail herein in reference to FIGS. 6A-6H and 7A-7F.

In various implementations, the sense amplifier architecture 404 may include latch transistors including transistors (L0, L1, L2, L3) that are cross-coupled between nodes sd/nsd. For instance, transistors (L0, L1) may be coupled between voltage supply (VDD) and footer transistor (F1), and transistors (L2, L3) may be coupled between voltage supply (VDD) and footer transistor (F1). Also, gates of transistors (L0, L1) may be coupled to node sd, and also, gates of transistors (L2, L3) may be coupled to node nsd. As such, in some instances, transistors (L0, L1) may be activated/enabled with an sd node signal, and also, transistors (L2, L3) may be activated/enabled with an nsd node signal.

In some instances, transistors (L0/L2 and L1/L3) may refer to P-type transistors and N-type transistors that are each formed in a single multi-transistor structure, such as, e.g., a 2-transistor (2T) structure or a 4-transistor (4T) structure. In reference to the 2T structure, transistors (L0, L2) may be formed in a first 2T P-type structure, and transistors (L1, L3) may be formed in a second 2T N-type structure. In some instances, each of transistors (L0, L2) may have an independent 2-transistor (2T) P-type structure, and each of transistors (L1, L3) may have an independent 2-transistor (2T) N-type structure. In reference to the 4T structure, transistors (L0/L2 and L1/L3) may be formed in a single 4T mixed-NP structure. As such, the latch transistors (L0/L2 and L1/L3) may be formed with a 4-transistor (4T) structure, e.g., using a single 4T structure. In other instances, each of transistors (L0, L2) may have an independent 4-transistor (4T) P-type structure, and each of transistors (L1, L3) may have an independent 4-transistor (4T) N-type structure. The 2T P-type structure may be formed with a P-over-P multi-transistor stack structure, and also, the 2T N-type structure may be formed with an N-over-N multi-transistor stack structure. Also, the 4T mixed-NP structure may be formed with a P-over-P-over-N-over-N multi-transistor stack structure or a N-over-N-over-P-over-P multi-transistor stack structure. The 4T P-type structure may be formed with a P-over-P-over-P-over-P multi-transistor stack structure, and the 4T N-type may be formed with a N-over-N-over-N-over-N multi-transistor stack structure. These multi-transistor stack structures are described in greater detail herein in reference to FIGS. 6A-6H and 7A-7F.

In various implementations, the sense amplifier architecture 404 may include a footer transistor including transistor (F1) that is coupled between transistors (L1, L3) and ground (VSS or GND). Also, in some instances, transistor (F1) may be activated/enabled with a sense amplifier enable signal (SAE). Moreover, node G may provide a first output signal (OUT_1), and node H may provide a second output signal (OUT_2).

In some instances, transistor (F1) may refer to an N-type transistor formed in a single multi-transistor structure, such as, e.g., a 2-transistor (2T) structure or a 4-transistor (4T) structure. In reference to the 2T structure, transistor (F1) may be formed in a single 2T structure, wherein only one of the 2T transistors may be used. In reference to the 4T structure, transistor (F1) may be formed in a single 4T structure, wherein only one of the 4T transistors may be used. The 2T N-type structure may be formed with an N-over-N multi-transistor stack structure. Also, the 4T N-type structure may be formed with an N-over-N-over-N-over-N multi-transistor stack structure. These multi-transistor stack structures are described herein in reference to FIGS. 6A-6H and 7A-7F.

In some implementations, in reference to FIGS. 1-4, the memory architecture described herein may refer to a device having a multi-transistor logic structure for use in memory architecture, wherein the multi-transistor logic structure may include at least one pair of P-type transistors that are arranged in a P-over-P multi-transistor stack.

In some instances, as shown in FIG. 2, the multi-transistor logic structure may refer to a header structure that includes the pair of P-type transistors as a first pair of P-type transistors, and the header structure includes a second pair of P-type transistors that are arranged in a first single stack with the first pair of P-type transistors in a first P-over-P-over-P-over-P (PPPP) multi-transistor stack. Further, the header structure may include a third pair of P-type transistors and a fourth pair of P-type transistors that are arranged in a second single stack with the third pair of P-type transistors in a second P-over-P-over-P-over-P (PPPP) multi-transistor stack.

Also, as shown in FIG. 2, the multi-transistor logic structure may refer to a precharge structure that includes the pair of P-type transistors as a first pair of P-type transistors, and the precharge structure includes a second pair of P-type transistors that are arranged in a first single stack with the first pair of P-type transistors in a first P-over-P-over-P-over-P (PPPP) multi-transistor stack. Further, the precharge structure includes a third pair of P-type transistors and a fourth pair of P-type transistors that are arranged in a second single stack with the third pair of P-type transistors in a second P-over-P-over-P-over-P (PPPP) multi-transistor stack, and also, at least one of the pairs of P-type transistors in the first single stack or the second single stack are unused.

In some instances, as shown in FIG. 3, the multi-transistor logic structure may refer to a read multiplexer structure that includes the pair of P-type transistors as a first pair of P-type transistors, and the read multiplexer structure includes a second pair of P-type transistors that are arranged in a single stack with the first pair of P-type transistors in a P-over-P-over-P-over-P (PPPP) multi-transistor stack.

Also, as shown in FIG. 3, the multi-transistor logic structure may refer to a write multiplexer structure for use in the memory architecture, and the write multiplexer structure includes a pair of N-type transistors arranged in an N-over-N multi-transistor stack. Further, the write multiplexer structure includes the pair of N-type transistors as a first pair of N-type transistors, and also, the write multiplexer structure includes a second pair of N-type transistors that are arranged in a single stack with the first pair of N-type transistors in an N-over-N-over-N-over-N (NNNN) multi-transistor stack.

In some instances, as shown in FIG. 4, the multi-transistor logic structure refers to a sense amplifier structure that includes the pair of P-type transistors as a first pair of P-type transistors, and the sense amplifier structure includes a second pair of P-type transistors arranged in a first single stack with the first pair of P-type transistors in a first P-over-P-over-P-over-P (PPPP) multi-transistor stack. The sense amplifier structure includes a third pair of P-type transistors and a fourth pair of P-type transistors that are arranged in a second single stack with the third pair of P-type transistors in a second P-over-P-over-P-over-P (PPPP) multi-transistor stack, and also, at least three of the P-type transistors in the first single stack and the second single stack are unused.

Also, in other instances, as shown in FIG. 4, the multi-transistor logic structure refers to a sense amplifier structure that includes a first pair of N-type transistors. Further, the sense amplifier structure includes a second pair of N-type transistors that are arranged in a single stack with the first pair of N-type transistors in an N-over-N-over-N-over-N (NNNN) multi-transistor stack, and at least one of the pairs of N-type transistors in the first pair of N-type transistors or the second pair of N-type transistors are unused.

In some implementations, in reference to FIGS. 1-4, the memory architecture described herein may refer to a device having a multi-transistor logic structure for use in memory architecture, wherein the multi-transistor logic structure may include at least one pair of N-type transistors that are arranged in an N-over-N multi-transistor stack.

In some instances, as shown in FIG. 3, the multi-transistor logic structure may refer to a write multiplexer structure that includes the pair of N-type transistors as a first pair of N-type transistors, and the write multiplexer structure includes a second pair of N-type transistors that are arranged in a single stack with the first pair of N-type transistors in an N-over-N-over-N-over-N (NNNN) multi-transistor stack. Further, the multi-transistor logic structure refers to a write multiplexer structure that includes the pair of N-type transistors as a first pair of N-type transistors, and the write multiplexer structure includes a second pair of N-type transistors that are arranged in a single stack with the first pair of N-type transistors in an N-over-N-over-N-over-N (NNNN) multi-transistor stack.

Figure 5A:
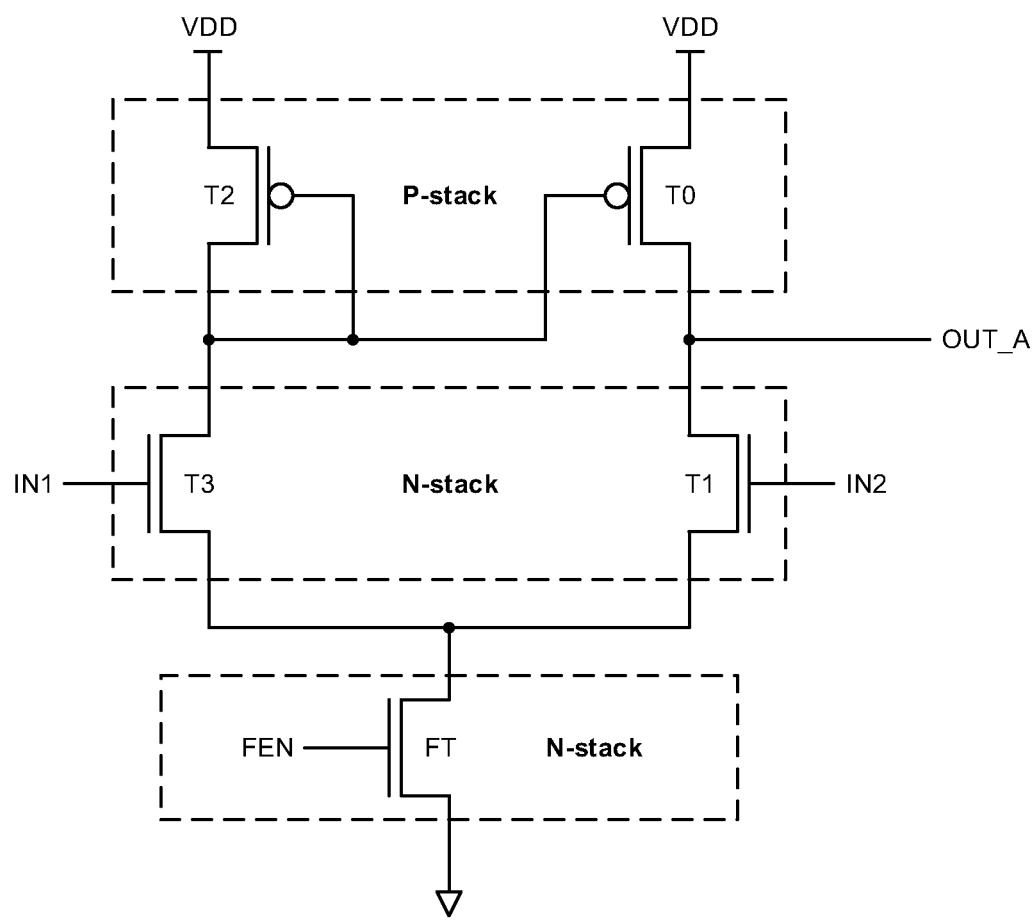
FIGS. 5A-5B illustrate various schematic diagrams of amplifier architecture in accordance with various implementations described herein.
Figure 5B:
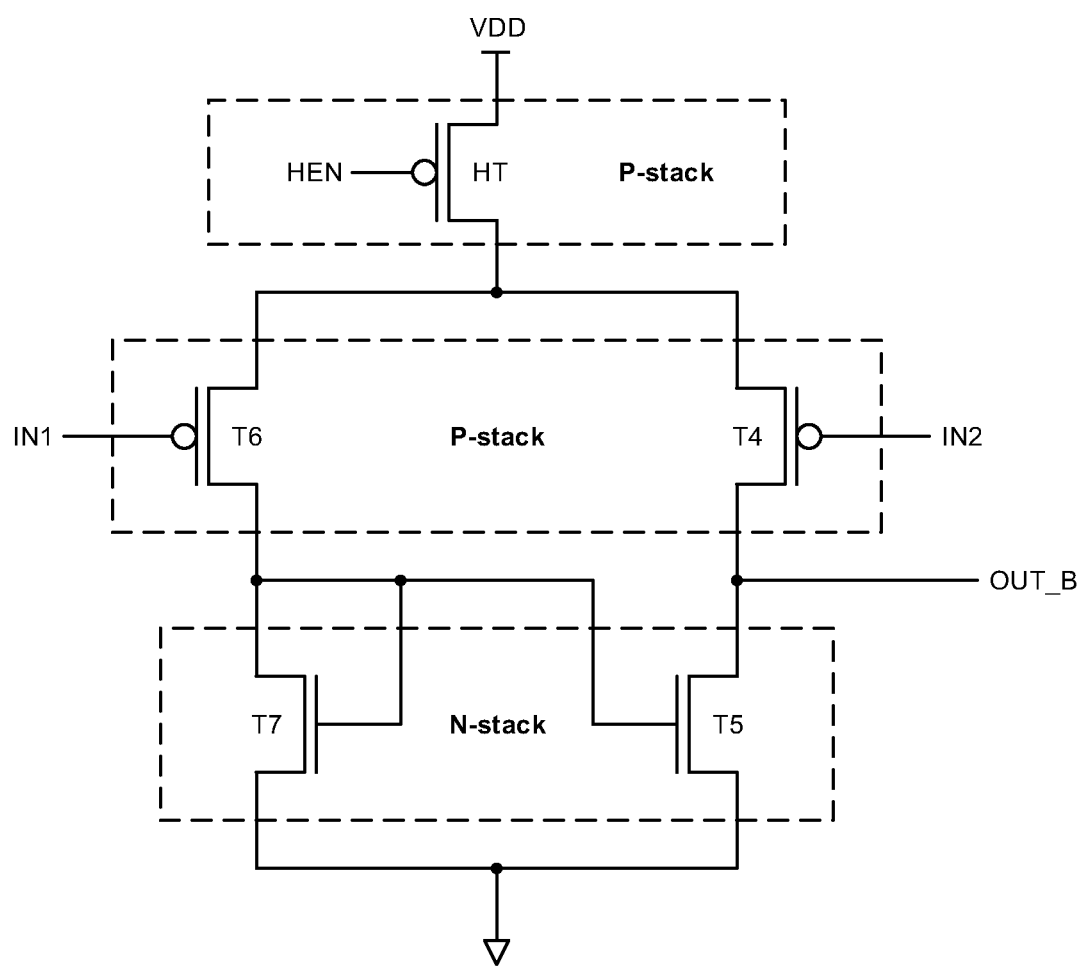

FIGS. 5A-5B illustrate various schematic diagrams of amplifier architecture in accordance with various implementations described herein. In particular, FIG. 5A shows a schematic diagram 500A of amplifier architecture 504A, and FIG. 5B shows another schematic diagram 500B of another amplifier architecture 504B.

As shown in FIG. 5A, the amplifier architecture 504A may include transistors (T0, T1, T2, T3, FT) that are coupled together between voltage supply (VDD) and ground (VSS or GND). For instance, transistors (T0, T2) may be coupled between voltage supply (VDD) and transistors (T1, T3), and also, transistors (T1, T3) may be coupled between transistors (T0, T2) and footer transistor (F1), and also, the footer transistor (FT) may be coupled between transistors (T1, T3) and ground (VSS or GND). In some instances, gates of transistors (T0, T2) may be coupled to the output of transistor (T2). Also, in some instances, transistors (T0, T2) may be activated/enabled with the output of transistor (T2), and transistors (T1, T3) may be activated/enabled with input signals (IN1, IN2). Further, the footer transistor (F1) may be activated/enabled a footer enable signal (FEN), and also, the amplifier architecture 504A may provide an output signal (OUT_A) as output from an output node disposed between transistors (T0, T1).

In some instances, transistors (T0/T2 and T1/T3) may refer to P-type transistors and N-type transistors that are each formed in a single multi-transistor structure, such as, e.g., a 2-transistor (2T) structure or a 4-transistor (4T) structure. In reference to the 2T structure, transistors (T0, T2) may be formed in a first 2T structure, and transistors (T1, T3) may be formed in a second 2T structure. In reference to the 4T structure, transistors (T0/T2 and T1/T3) may be formed in a single 4T structure. As such, the latch transistors (T0/T2 and T1/T3) may be formed with a 4-transistor (4T) structure, e.g., using a single 4T structure. The first 2T P-type structure may be formed with a P-over-P multi-transistor stack structure, and also, the second 2T N-type structure may be formed with an N-over-N multi-transistor stack structure. Also, the 4T N-type structure may be formed with a P-over-P-over-N-over-N multi-transistor stack structure or a N-over-N-over-P-over-P multi-transistor stack structure. These types of multi-transistor stack structures are described in greater detail herein in reference to FIGS. 6A-6H and 7A-7F.

Also, in some instances, footer transistor (FT) may refer to an N-type transistor formed in a single multi-transistor structure, such as, e.g., a 2-transistor (2T) structure or a 4-transistor (4T) structure. In reference to the 2T structure, the footer transistor (FT) may be formed in a single 2T structure, wherein only one of the 2T transistors may be used. In reference to the 4T structure, the footer transistor (FT) may be formed in a single 4T structure, wherein only one of the 4T transistors may be used. The 2T N-type structure may be formed with an N-over-N multi-transistor stack structure. Also, the 4T N-type structure may be formed with an N-over-N-over-N-over-N multi-transistor stack structure. These types of multi-transistor stack structures are described herein in reference to FIGS. 6A-6H and 7A-7F.

As shown in FIG. 5B, the amplifier architecture 504B may include transistors (HT, T5, T6, T7, T7) that are coupled together between voltage supply (VDD) and ground (VSS or GND). For instance, header transistor (HT) may be coupled between the voltage supply (VDD) and transistors (T4, T6), and transistors (T4, T6) may be coupled between the header transistor (HT) and transistors (T5, T7), and also, transistors (T5, T7) may be coupled between transistors (T4, T6) and ground (VSS or GND). In various instances, gates of transistors (T5, T7) may be coupled to the output of transistor (T6). Also, in some instances, transistors (T5, T7) may be activated/enabled with the output of transistor (T6), and transistors (T5, T7) may be activated/enabled with input signals (IN1, IN2). Further, the header transistor (H1) may be activated/enabled a header enable signal (HEN), and the amplifier architecture 504B may provide an output signal (OUT B) as output from an output node disposed between transistors (T4, T5).

In some instances, transistors (T4/T6 and T5/T7) may refer to P-type transistors and N-type transistors that are each formed in a single multi-transistor structure, such as, e.g., a 2-transistor (2T) structure or a 4-transistor (4T) structure. In reference to the 2T structure, transistors (T4, T6) may be formed in a first 2T structure, and transistors (T5, T7) may be formed in a second 2T structure. In reference to the 4T structure, transistors (T4/T6 and T5/T7) may be formed in a single 4T structure. As such, the latch transistors (T4/T6 and T5/T7) may be formed with a 4-transistor (4T) structure, e.g., using a single 4T structure. The first 2T P-type structure may be formed with a P-over-P multi-transistor stack structure, and also, the second 2T N-type structure may be formed with an N-over-N multi-transistor stack structure. Also, the 4T N-type structure may be formed with a P-over-P-over-N-over-N multi-transistor stack structure or a N-over-N-over-P-over-P multi-transistor stack structure. These types of multi-transistor stack structures are described in greater detail herein in reference to FIGS. 6A-6H and 7A-7F.

Also, in some instances, header transistor (HT) may refer to a P-type transistor formed in a single multi-transistor structure, such as, e.g., a 2-transistor (2T) structure or a 4-transistor (4T) structure. In reference to the 2T structure, the header transistor (HT) may be formed in a single 2T structure, wherein only one of the 2T transistors may be used. In reference to the 4T structure, the header transistor (HT) may be formed in a single 4T structure, wherein only one of the 4T transistors may be used. The 2T P-type structure may be formed with a P-over-P multi-transistor stack structure. Also, the 4T P-type structure may be formed with a P-over-P-over-P-over-P multi-transistor stack structure. These types of multi-transistor stack structures are described herein in reference to FIGS. 6A-6H and 7A-7F.

FIGS. 6A-6H illustrate various diagrams of multi-transistor stack architecture in accordance with various implementations described herein. In particular, FIGS. 6A, 6C, 6E and 6G show various diagrams of the multi-transistor stack with a single common-gate architecture, and in addition, FIGS. 6B, 6D, 6F and 6H show various diagrams of the multi-transistor stack with a split-gate architecture.

Figure 6A:
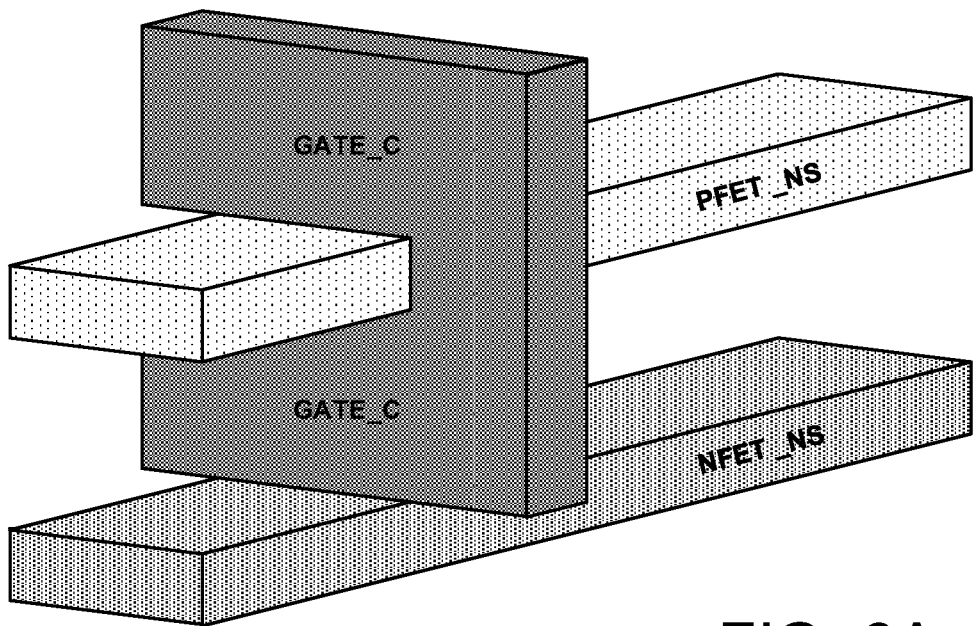
FIGS. 6A-6H illustrate various diagrams of multi-transistor stack architecture with 2T configurations in accordance with various implementations described herein.

As shown in FIG. 6A, the P-over-N common-gate multi-transistor architecture 604A may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, in some instances, the common-gate architecture 604A may refer to a single gate (e.g., single poly gate) coupled to the multiple transistors, such as, e.g., the single common-gate (GATE_C) coupled to the PFET_NS device and the NFET_NS device. This arrangement may provide the P-over-N (PN) stack configuration as a two-FET stacked device that is manufactured and/or formed in a single monolithic semiconductor die. Also, in various instances, the complementary P-type and N-type transistors refer to P-type and N-type field-effect transistors (PFET and NFET) that are disposed as a pair of transistors arranged in the P-over-N stack configuration. Also, in some instances, the P-over-N multi-transistor architecture 604A with the common-gate (GATE_C) may be used to implement an inverter.

Figure 6B:
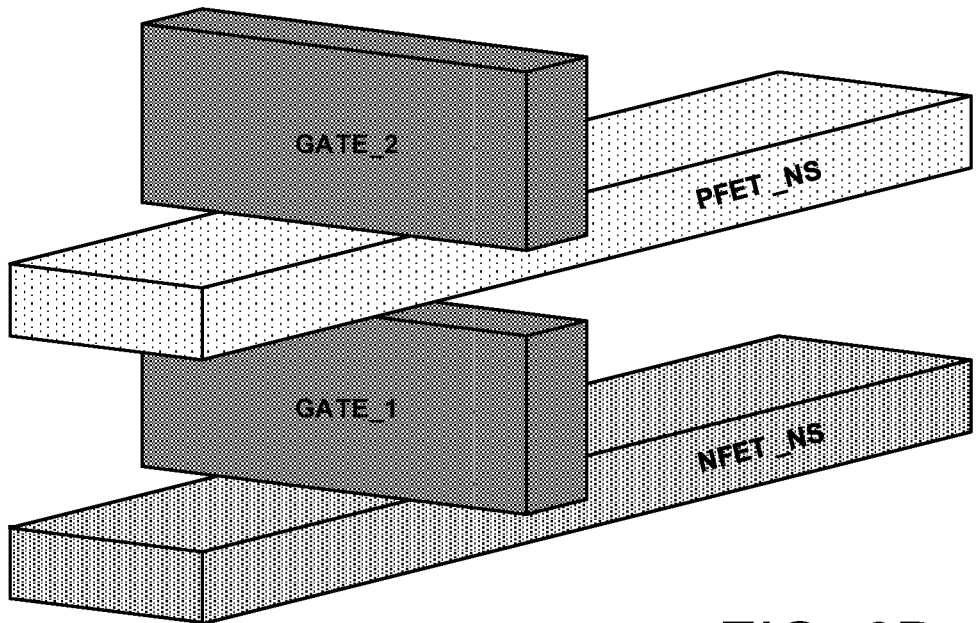

As shown in FIG. 6B, the P-over-N split-gate multi-transistor architecture 604B may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, the split-gate architecture 604B may refer to multiple gates (e.g., dual poly gates) coupled to the multiple transistors, such as, e.g., a first gate (GATE_1) of the split-gate coupled to the NFET_NS device and a second gate (GATE_2) of the split-gate coupled to the PFET_NS device. Also, this arrangement may provide the P-over-N (PN) stack configuration as a two-FET stacked device that is manufactured and/or formed in a single monolithic semiconductor die. Moreover, in some instances, the complementary P-type and N-type transistors refer to PFET/NFET devices that are disposed as a pair of transistors arranged in the P-over-N stack configuration.

Figure 6C:
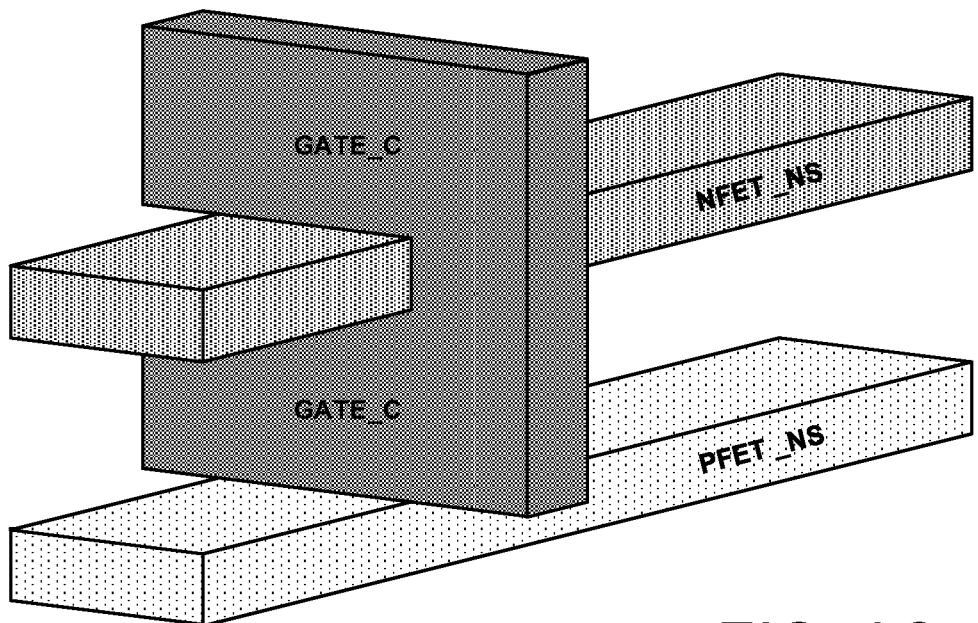

As shown in FIG. 6C, the N-over-P common-gate multi-transistor architecture 604C may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, in some instances, the common-gate architecture 604C may refer to a single gate (e.g., single poly gate) coupled to the multiple transistors, such as, e.g., the single common-gate (GATE_C) coupled to the NFET_NS device and the PFET_NS device. This arrangement provides the N-over-P (NP) stack configuration as a two-FET stacked device that is manufactured and/or formed in a single monolithic semiconductor die. Further, in some instances, the complementary N-type and P-type transistors refer to NFET and PFET devices disposed as a pair of transistors that are arranged in the N-over-P stack configuration. Also, in some instances, the N-over-P multi-transistor architecture 604C with the common-gate (GATE_C) may be used to implement an inverter.

Figure 6D:
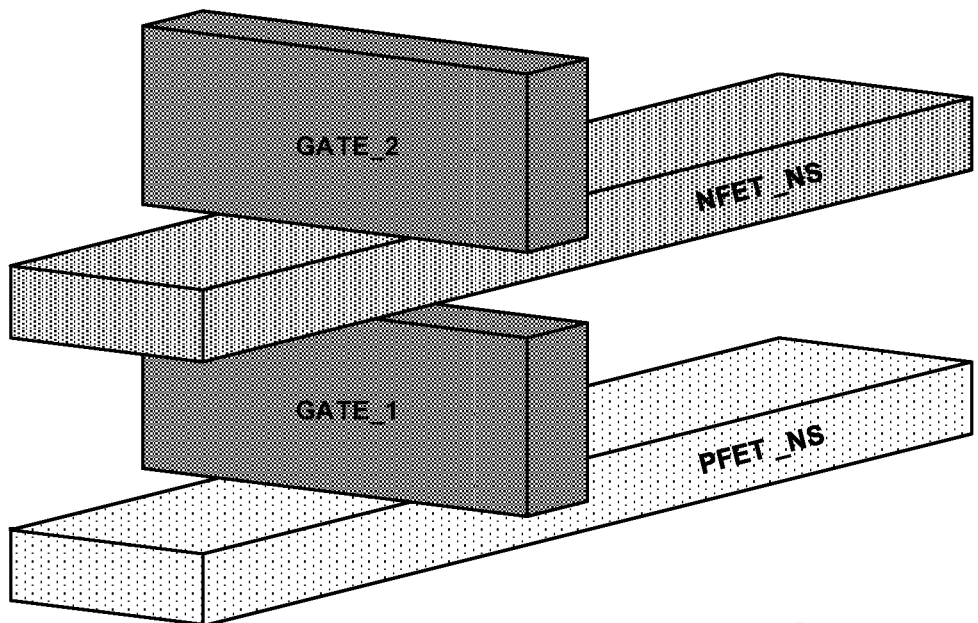

As shown in FIG. 6D, the N-over-P split-gate multi-transistor architecture 604D may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, the split-gate architecture 604D may refer to multiple gates (e.g., dual poly gates) coupled to the multiple transistors, such as, e.g., a first gate (GATE_1) of the split-gate coupled to the PFET_NS device and a second gate (GATE_2) of the split-gate coupled to the NFET_NS device. Also, this arrangement may provide the N-over-P (NP) stack configuration as a two-FET stacked device that is manufactured and/or formed in a single monolithic semiconductor die. Moreover, in some instances, the complementary N-type and P-type transistors refer to NFET/PFET devices that are disposed as a pair of transistors arranged in the N-over-P stack configuration.

Figure 6E:
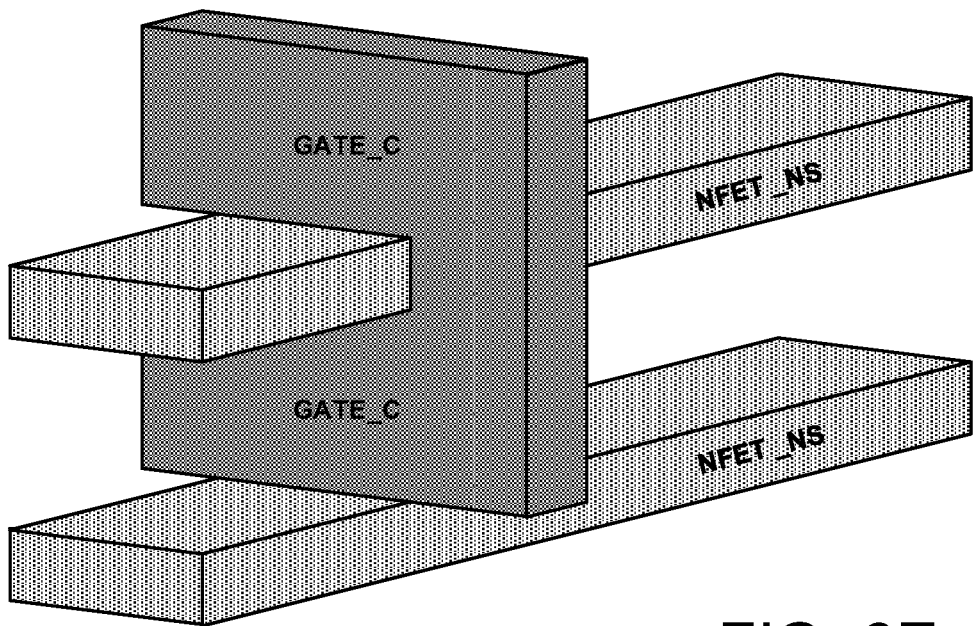

As shown in FIG. 6E, the N-over-N common-gate multi-transistor architecture 604E may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the common-gate architecture 604E refers to a single gate (e.g., single poly gate) coupled to the multiple transistors, such as, e.g., the single common-gate (GATE_C) coupled to the NFET_NS_1 device and the NFET_NS_2 device. This arrangement provides the N-over-N(NN) stack configuration as a two-FET stacked device that is manufactured and/or formed in a single monolithic semiconductor die. Moreover, in some instances, the dual N-over-N transistors refer to an NFET-over-NFET device disposed as a pair of transistors that are arranged in the N-over-N(NN) stack configuration.

In some implementations, the N-over-N multi-device stack 604E may refer to a device having a multi-transistor logic structure for use in memory architecture, wherein the multi-transistor logic structure has multiple transistors that are arranged in a single multi-transistor stack used to increase strength of the device. For instance, as shown in FIG. 6E, the N-over-N multi-device stack 604E includes two N-type transistors arranged in a single multi-transistor stack with a common-gate (GATE_C) that is used to increase strength of the device by a factor of two (e.g., double strength). In some instances, the common-gate (or single-gate) may be used to activate both transistors at the same time, which effectively doubles the strength of the N-over-N multi-device stack 604E. In other instances, three transistors in a single stack with a common-gate may be used to increase strength of a device by a factor of three (e.g., triple strength). Also, in other instances, four transistors in a single stack with a common-gate may be used to increase strength of a device by a factor of four (e.g., quadruple strength).

Figure 6F:
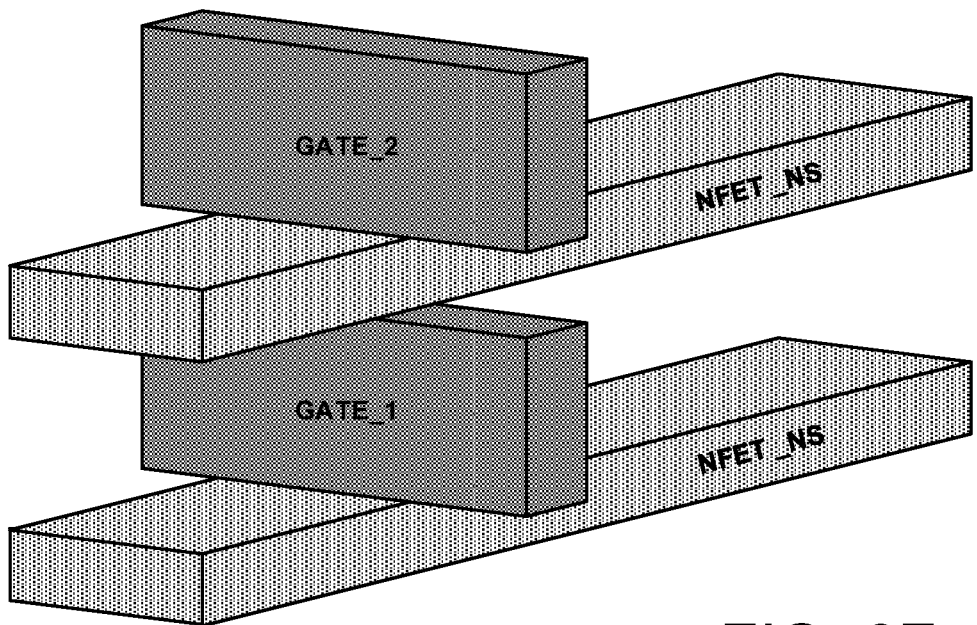

As shown in FIG. 6F, the N-over-N split-gate multi-transistor architecture 604F may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the split-gate architecture 604F may refer to multiple gates (e.g., dual poly gates) coupled to the multiple transistors, such as, e.g., a first gate (GATE_1) of the split-gate coupled to the NFET_NS_1 device and also a second gate (GATE_2) of the split-gate coupled to the NFET_NS_2 device. Also, as shown, this arrangement may provide the N-over-N(NN) stack configuration as a two-FET stacked device that is manufactured and/or formed in a single monolithic semiconductor die. Moreover, in some instances, the dual N-over-N transistors refer to an NFET-over-NFET device disposed as a pair of transistors that are arranged in the N-over-N(NN) stack configuration.

Figure 6G:
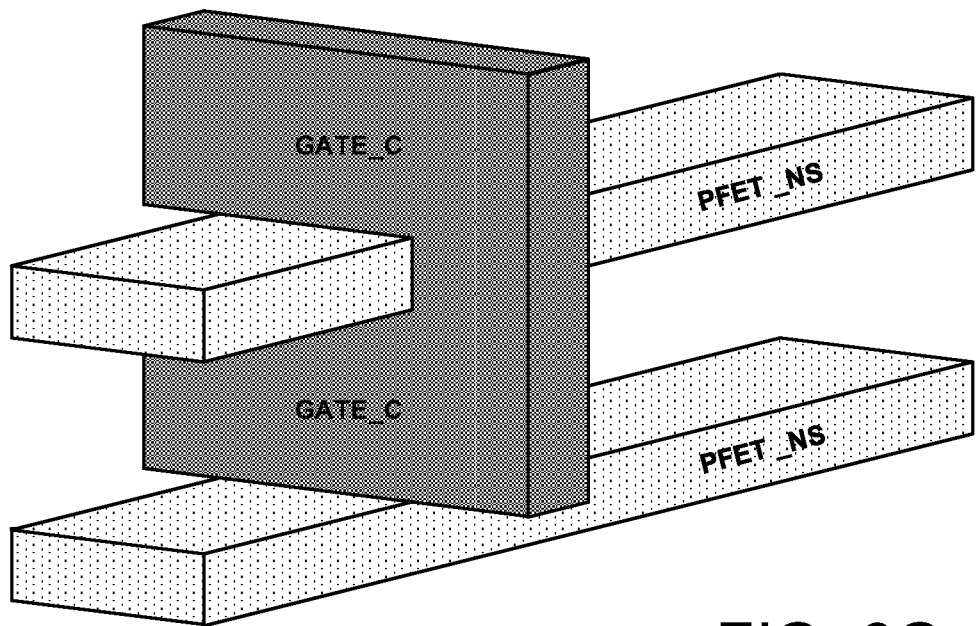

As shown in FIG. 6G, the P-over-P common-gate multi-transistor architecture 604E may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the common-gate architecture 604G refers to a single gate (e.g., single poly gate) coupled to the multiple transistors, such as, e.g., the single common-gate (GATE_C) coupled to the PFET_NS_1 device and the PFET_NS_2 device. This arrangement provides the P-over-P (PP) stack configuration as a two-FET stacked device that is manufactured and/or formed in a single monolithic semiconductor die. Moreover, in some instances, the dual P-over-P transistors refer to a PFET-over-PFET device disposed as a pair of transistors that are arranged in the P-over-P (PP) stack configuration.

In some implementations, the P-over-P multi-device stack 604G may refer to a device having a multi-transistor logic structure for use in memory architecture, wherein the multi-transistor logic structure has multiple transistors that are arranged in a single multi-transistor stack used to increase strength of the device. For instance, as shown in FIG. 6G, the P-over-P multi-device stack 604G includes two P-type transistors arranged in a single multi-transistor stack with a common-gate (GATE_C) that is used to increase strength of the device by a factor of two (e.g., double strength). In some instances, the common-gate (or single-gate) may be used to activate both transistors at the same time, which effectively doubles the strength of the P-over-P multi-device stack 604G. In other instances, three transistors in a single stack with a common-gate may be used to increase strength of a device by a factor of three (e.g., triple strength). Also, in other instances, four transistors in a single stack with a common-gate may be used to increase strength of a device by a factor of four (e.g., quadruple strength).

Figure 6H:
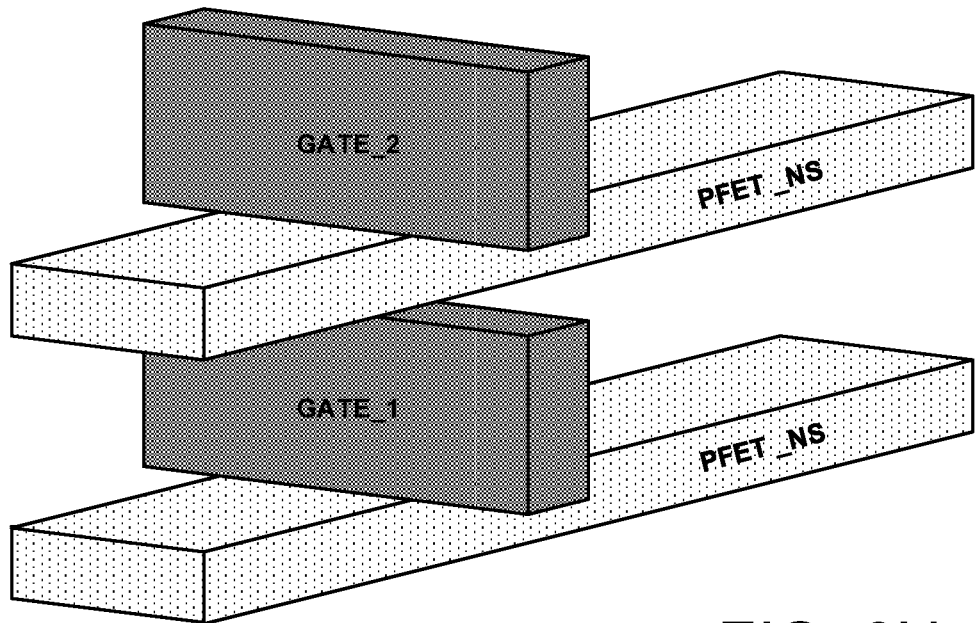

As shown in FIG. 6H, the P-over-P split-gate multi-transistor architecture 604H may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the split-gate architecture 604H may refer to multiple gates (e.g., dual poly gates) coupled to the multiple transistors, such as, e.g., a first gate (GATE_1) of the split-gate coupled to the PFET_NS_1 device and also a second gate (GATE_2) of the split-gate coupled to the PFET_NS_2 device. Also, as shown, this arrangement may provide the P-over-P (PP) stack configuration as a two-FET stacked device that is manufactured and/or formed in a single monolithic semiconductor die. Moreover, in some instances, the dual P-over-P transistors refer to a PFET-over-PFET device disposed as a pair of transistors that are arranged in the P-over-P (PP) stack configuration.

In some implementations, in reference to FIGS. 6A-6H, the gate architectures may utilize a common-gate architecture and/or a split-gate architecture. For instance, as shown in FIGS. 6A, 6C, 6E and 6G, the multiple transistors (PFET and NFET) may share a single gate structure. Thus, the pair of stacked PFET/NFET devices may share a single common-gate structure. In other instances, as shown in FIGS. 6B, 6D, 6F and 6H, the multiple transistors (PFET and NFET) may utilize a split-gate structure. Thus, the pair of stacked PFET/NFET devices may share a dual split-gate structure.

FIGS. 7A-7F illustrate various diagrams of multi-transistor stack architecture with 4T configurations in accordance with implementations described herein. In particular, FIGS. 7A-7F show diagrams of the multi-transistor stack with common-gate architecture; however, in various other implementations, the multi-transistor stack may be configured with split-gate architecture, instead of common-gate architecture.

Figure 7A:
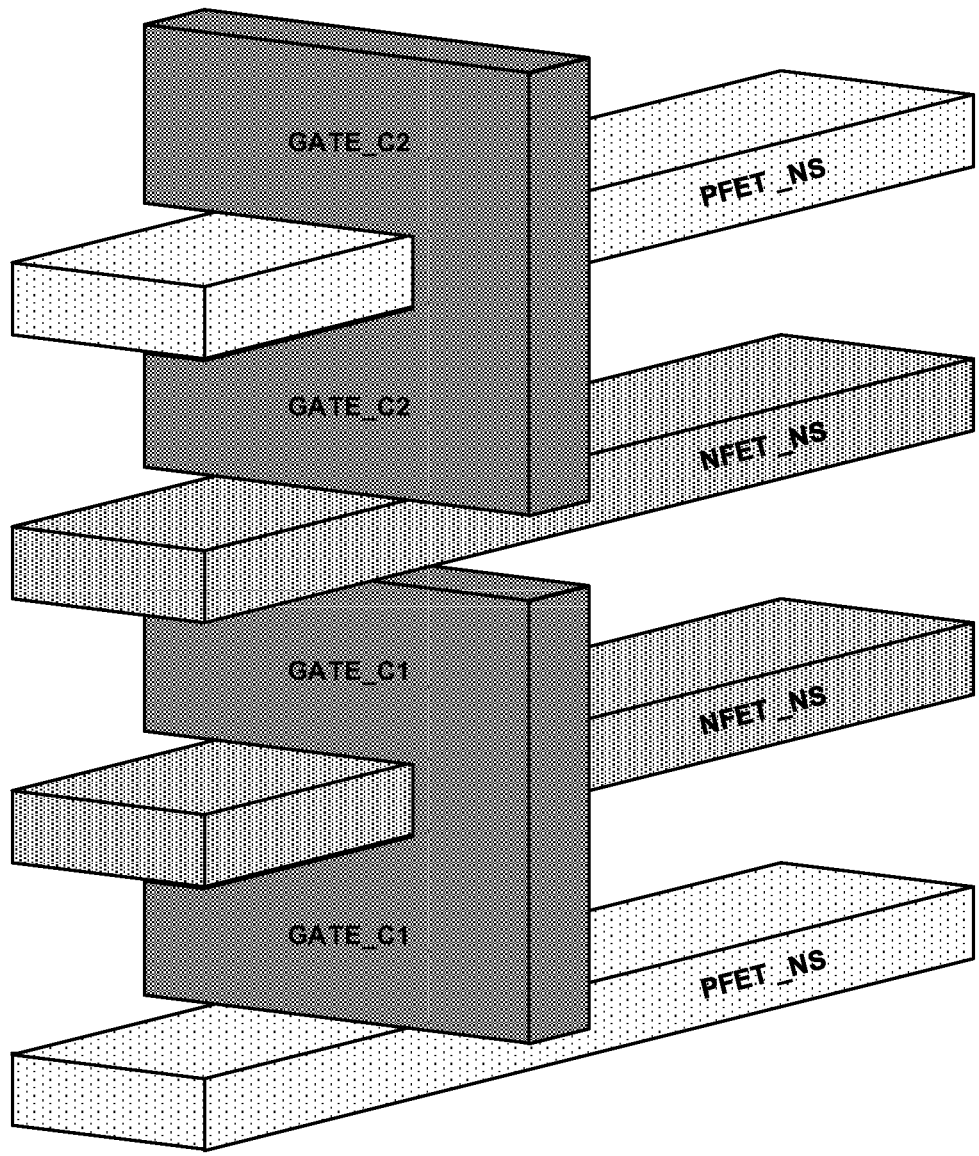
FIGS. 7A-7F illustrate various diagrams of multi-transistor stack architecture with 4T configurations in accordance with various implementations described herein.

As shown in FIG. 7A, the P-over-N-over-N-over-P (PNNP) dual-common-gate related transistor architecture 704A may include multiple transistors (e.g., 2 PFET devices and 2 NFET devices) that are arranged in a multi-transistor stack configuration. In some instances, a first PFET may be formed in a first PFET nano-sheet (PFET_NS_1), and a second PFET may be formed in a second PFET nano-sheet (NFET_NS_2), which may be disposed vertically in a single stack. Also, a first NFET may be formed in a first NFET nano-sheet (NFET_NS_1), and a second NFET may be formed in a second NFET nano-sheet (NFET_NS_2), which may be disposed vertically in the same single stack with the PFET devices. The common-gate architecture 704A may include multiple common-gates (e.g., dual poly gate lines) coupled to the multiple transistors. In some instances, a first common-gate (GATE_C1) may be coupled to the PFET_NS_1 device and NFET_NS_1 device, and also, a second common-gate (GATE_C2) may be coupled to the NFET_NS_2 device and PFET_NS_2 device. This multi-device stack arrangement provides the PNNP stack configuration as a four-FET stacked device that is manufactured and/or formed in a same single monolithic semiconductor die. Further, in some instances, the pair of N-type devices may be disposed between the pair of P-type devices in the multi-transistor stack architecture 704A along with the dual-common-gate structure.

Figure 7B:
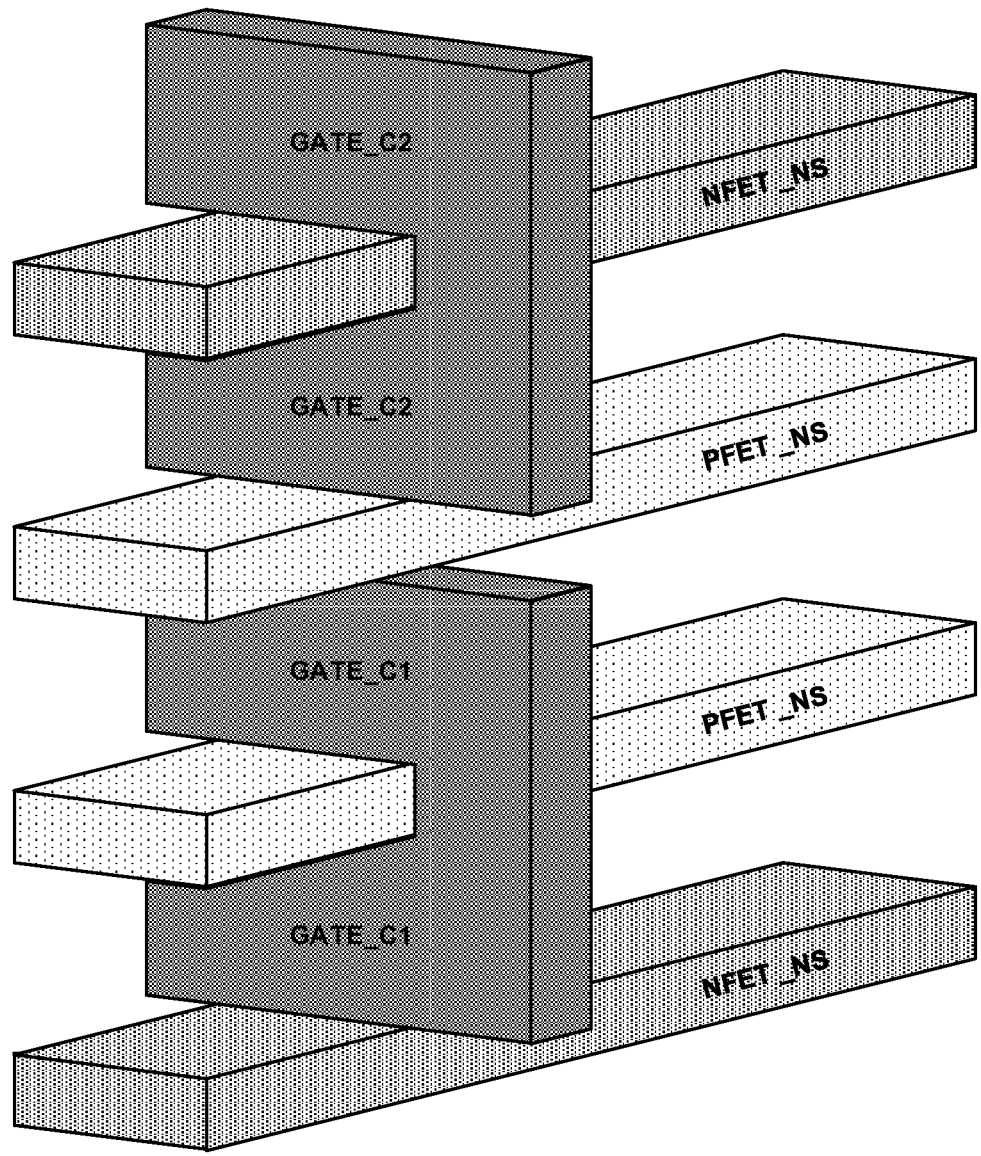

As shown in FIG. 7B, the N-over-P-over-P-over-N (NPPN) dual-common-gate related transistor architecture 704B may include multiple transistors (e.g., 2 NFET devices and 2 PFET devices) that are arranged in a multi-transistor stack configuration. In some instances, a first NFET may be formed in a first NFET nano-sheet (NFET_NS_1), and a second NFET may be formed in a second NFET nano-sheet (NFET_NS_2), which may be disposed vertically in a single stack. Also, a first PFET may be formed in a first PFET nano-sheet (PFET_NS_1), and a second PFET may be formed in a second PFET nano-sheet (PFET_NS_2), which may be disposed vertically in the same single stack with the NFET devices. The common-gate architecture 704B may have multiple common-gates (e.g., dual poly gate lines) coupled to the multiple transistors. In some instances, a first common-gate (GATE_C1) may be coupled to the NFET_NS_1 device and PFET_NS_1 device, and also, a second common-gate (GATE_C2) may be coupled to the PFET_NS_2 device and NFET_NS_2 device. This multi-device stack arrangement provides the NPPN stack configuration as a four-FET stacked device that is manufactured and/or formed in a same single monolithic semiconductor die. Further, in some instances, the pair of P-type devices may be disposed between the pair of N-type devices in the multi-transistor stack architecture 704B along with the dual-common-gate structure.

Figure 7C:
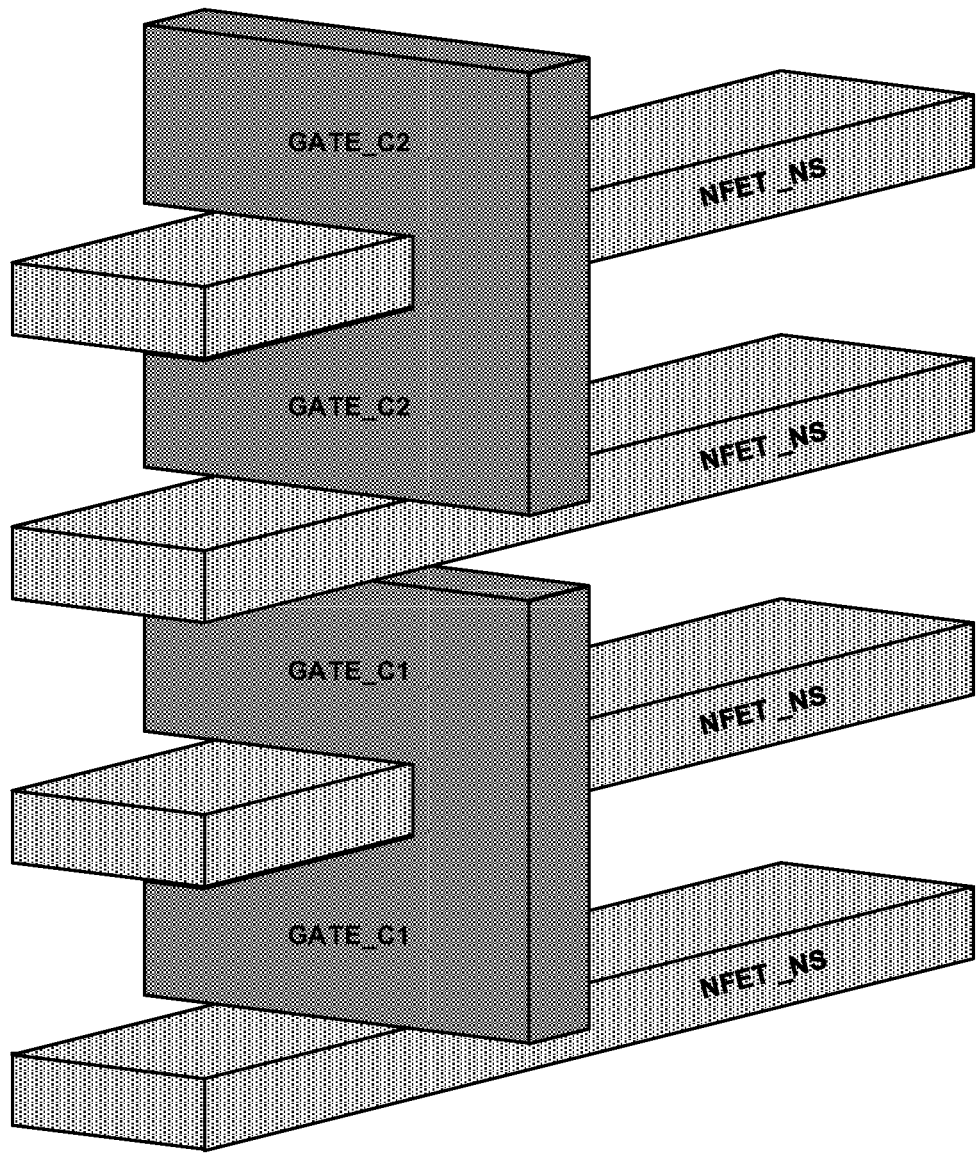

As shown in FIG. 7C, the N-over-N-over-N-over-N (NNNN) dual-common-gate related transistor architecture 704C may include multiple transistors (e.g., 4 NFET devices) that are arranged in a multi-transistor stack configuration. In some instances, a first NFET may be formed in a first NFET nano-sheet (NFET_NS_1), and a second NFET may be formed in a second NFET nano-sheet (NFET_NS_2), which may be disposed vertically in a single stack. Also, in some instances, a third NFET may be formed in a third NFET nano-sheet (NFET_NS_3), and a fourth NFET may be formed in a fourth NFET nano-sheet (NFET_NS_4), which may be disposed vertically in the same single stack with the other NFET devices. The common-gate architecture 704C includes multiple common-gates (e.g., dual poly gate lines) coupled to the multiple transistors. In some instances, a first common-gate (GATE_C1) may be coupled to NFET_NS_1 device and NFET_NS_2 device, and also, a second common-gate (GATE_C2) may be coupled to the NFET_NS_3 device and NFET_NS_4 device. This multi-device stack arrangement provides the NNNN stack configuration as a four-FET stacked device that is manufactured and/or formed in a same single monolithic semiconductor die. Further, in some instances, the quad-stack of N-type devices may be vertically disposed in the multi-transistor stack architecture 704C along with the dual-common-gate structure.

Figure 7D:
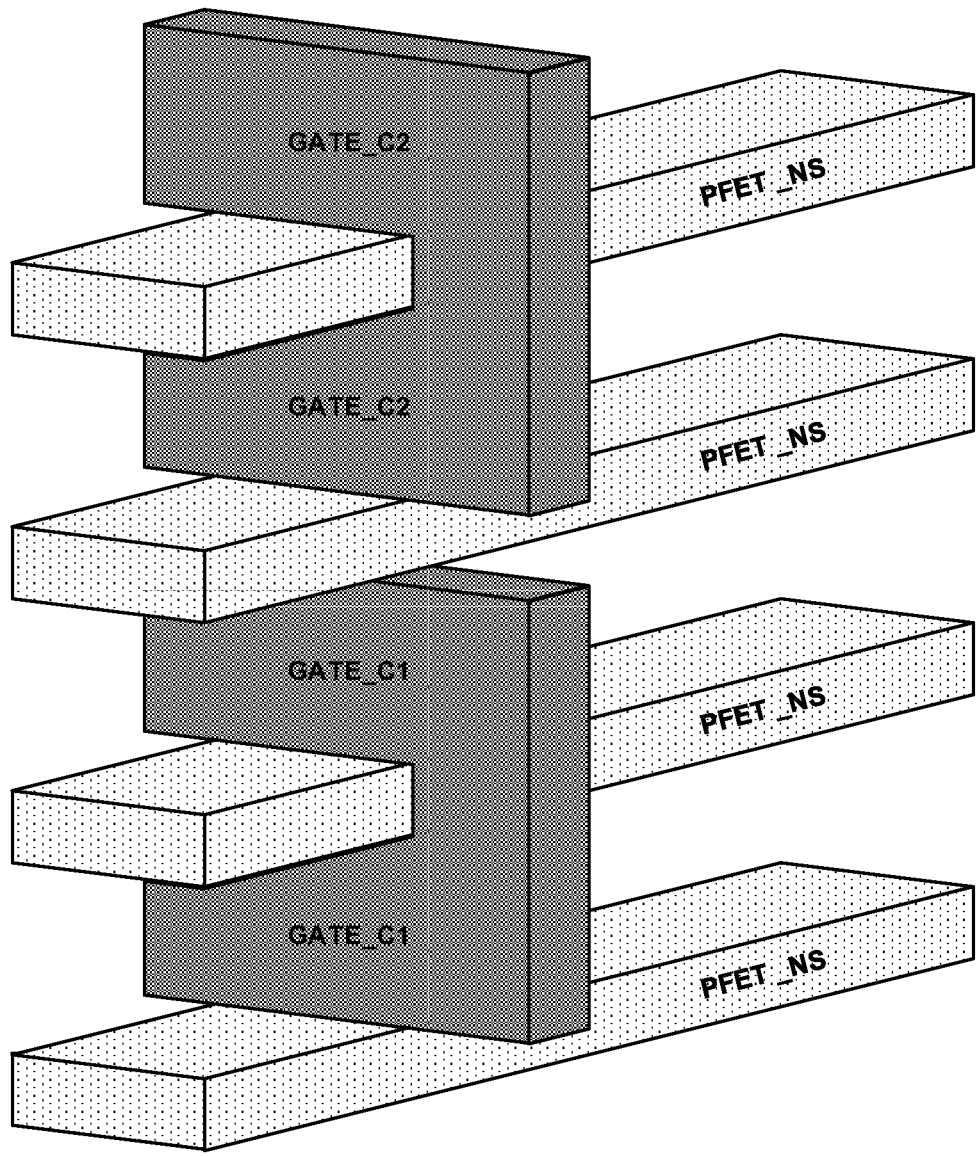

As shown in FIG. 7D, the P-over-P-over-P-over-P (PPPP) dual-common-gate related transistor architecture 704D may have multiple transistors (e.g., 4 PFET devices) that are arranged in a multi-transistor stack configuration. In some instances, a first PFET may be formed in a first PFET nano-sheet (PFET_NS_1), and a second PFET may be formed in a second PFET nano-sheet (PFET_NS_2), which may be disposed vertically in a single stack. Also, in various instances, a third PFET may be formed in a third PFET nano-sheet (PFET_NS_3), and a fourth PFET may be formed in a fourth PFET nano-sheet (PFET_NS_4), which may be disposed vertically in the same single stack with the other PFET devices. The common-gate architecture 704D has multiple common-gates (e.g., dual poly gate lines) coupled to the multiple transistors. In various instances, a first common-gate (GATE_C1) may be coupled to PFET_NS_1 device and the PFET_NS_2 device, and also, a second common-gate (GATE_C2) may be coupled to the PFET_NS_3 device and the PFET_NS_4 device. This multi-device stack arrangement may provide the PPPP stack configuration as a four-FET stacked device that is manufactured and/or formed in a same single monolithic semiconductor die. Moreover, in some instances, the quad-stack of P-type devices may be vertically disposed together in the multi-transistor stack architecture 704D along with the dual-common-gate structure.

Figure 7E:
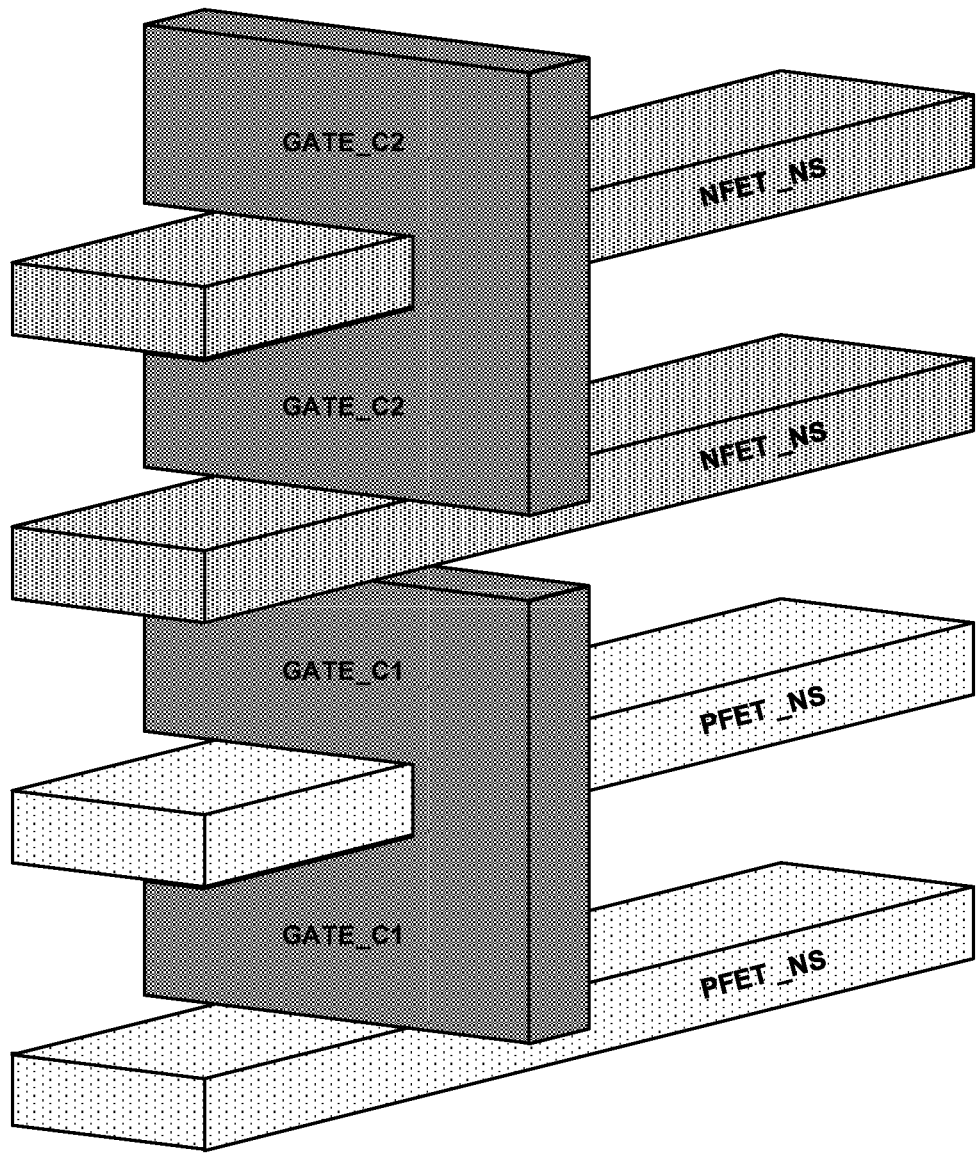
Figure 7F:
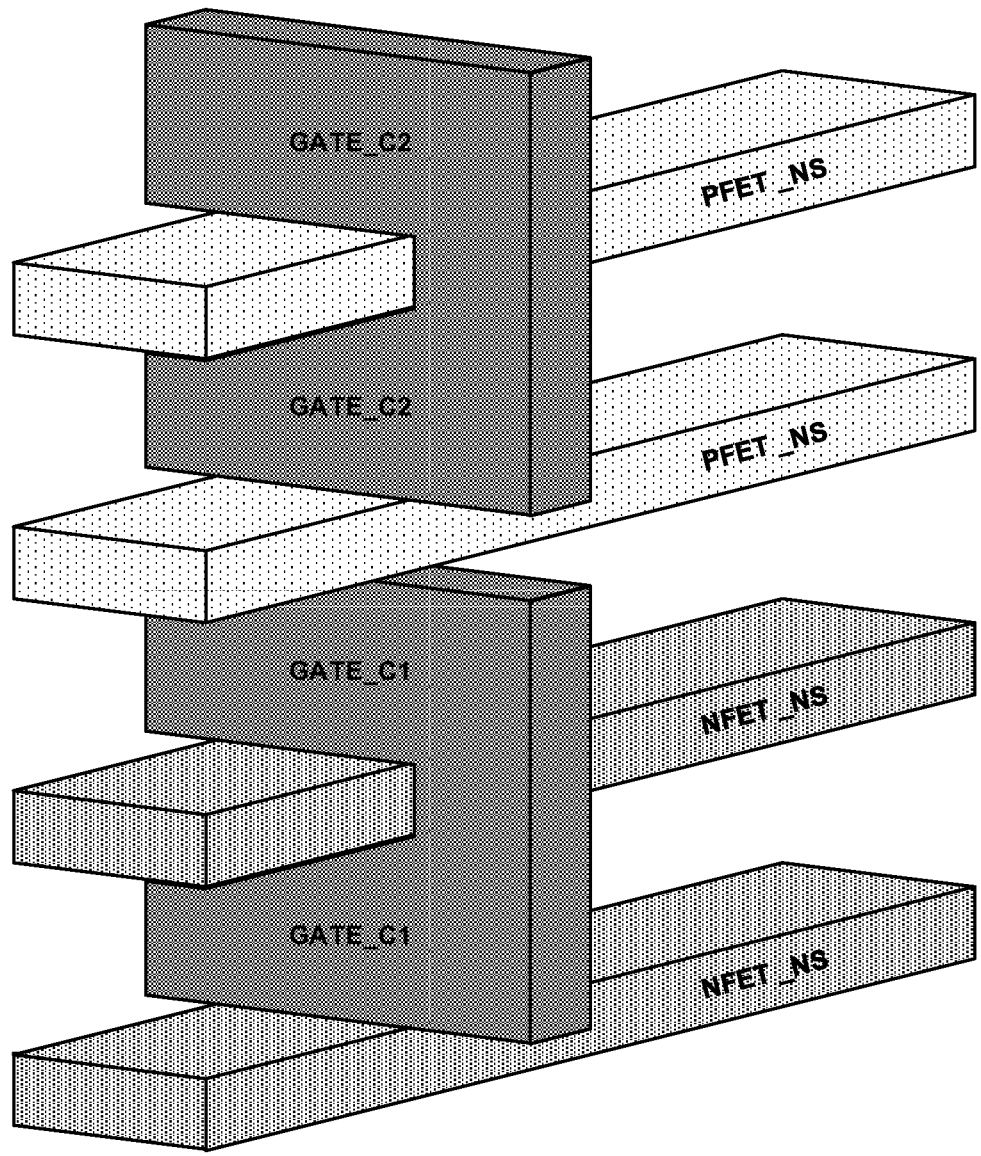

In some implementations, based on the foregoing description provided herein above in reference to FIGS. 7A-7D, the various multi-transistor fabrication schemes and techniques described herein may be utilized to implement various other multi-transistor stack configurations as shown in FIGS. 7E-7F.

As shown in FIG. 7E, a PPNN common-gate related transistor architecture 704E may provide for multiple transistors (e.g., 2 NFET devices and 2 PFET devices) arranged in a multi-transistor stack configuration. In some instances, the PPNN transistor architecture 704E may refer to an N-over-N-over-P-over-P stack structure.

For instance, as shown in FIG. 7F, an NNPP common-gate related transistor architecture 704F may provide for multiple transistors (e.g., 2 NFET devices and 2 PFET devices) arranged in a multi-transistor stack configuration. In some instances, the NNPP transistor architecture 704F may refer to a P-over-P-over-N-over-N stack structure.

The various implementations described herein refer to fabrication schemes and techniques that provide for various multi-transistor stack architectures in various physical layout designs for multi-transistor stack applications. In various instances, FIGS. 6A-6H provide for a two-transistor (e.g., 2T) stack architecture in the same, single vertical stack, and further, FIGS. 7A-7F provide for a four-transistor (e.g., 4T) stack architecture in the same, single vertical stack. Also, the various implementations described herein refer to a method for manufacturing, and/or causing to be manufactured, multiple devices packaged within a single semiconductor die. The multiple devices may have a number (F) of first devices (e.g., Ftransistors) that are arranged in a first multi-transistor stack with a first P-N configuration, and further, the multiple devices may include a number (S) of second devices (e.g., Stransistors) arranged in a second multi-transistor stack with a second P-N configuration that is different than the first P-N configuration.

In some implementations, each of the first multi-transistor stack and the second multi-transistor stack may be arranged in the same, single vertical stack with the common-gate architecture. Also, in other implementations, each of the first multi-transistor stack and the second multi-transistor stack may be arranged in the same, single vertical stack with the split-gate architecture. However, in various implementations, any type of different combinations may be used that seek to combine common-gate multi-transistor structures with split-gate multi-transistor structures. In some instances, a first multi-transistor stack may have a first two-transistor stack, and the second multi-transistor stack may have a second two-transistor stack. The first P-N configuration may refer to at least one of a P-over-N (PN) configuration, an N-over-P (NP) configuration, a P-over-P (PP) configuration, and an N-over-N(NN) configuration. The second P-N configuration may refer to at least one of a P-over-N (PN) configuration, an N-over-P (NP) configuration, a P-over-P (PP) configuration, and an N-over-N(NN) configuration. Also, in some instances, the first devices refer to first field-effect transistor (FET) devices including at least one of an N-type FET (NFET) and a P-type FET (PFET). Also, in some instances, the second devices refer second field-effect transistors (FET) including at least one of an N-type FET (NFET) and a P-type FET (PFET).

In various implementations, the first logic configuration may refer to at least one of a P-over-N (PN) two-transistor stack configuration, an N-over-P (NP) two-transistor stack configuration, a P-over-P (PP) two-transistor stack configuration, and an N-over-N(NN) two-transistor stack configuration. Further, in various implementations, the second logic configuration may refer to at least one of a P-over-N (PN) two-transistor stack configuration, an N-over-P (NP) two-transistor stack configuration, a P-over-P (PP) two-transistor stack configuration and an N-over-N(NN) two-transistor stack configuration that may be different than the first logic configuration. In various implementations, method 400 may be used to manufacture, or cause to be manufactured, any number (N) of multi-transistor (e.g., N transistors) stack architecture.

In various implementations, the first logic configuration may refer to at least one of a P-over-N-over-N-over-P (PNNP) four-transistor stack configuration, an N-over-P-over-P-over-N(NPPN) four-transistor stack configuration, an N-over-N-over-N-over-N (NNNN) four-transistor stack configuration, a P-over-P-over-P-over-P (PPPP) four-transistor stack configuration, a P-over-P-over-N-over-N (PPNN) four-transistor stack configuration, and an N-over-N-over-P-over-P (NNPP) four-transistor stack configuration. Further, in various implementations, the second logic configuration may refer to at least one of a P-over-N-over-N-over-P (PNNP) four-transistor stack configuration, an N-over-P-over-P-over-N(NPPN) four-transistor stack configuration, an N-over-N-over-N-over-N (NNNN) four-transistor stack configuration, a P-over-P-over-P-over-P (PPPP) four-transistor stack configuration, a P-over-P-over-N-over-N (PPNN) four-transistor stack configuration, and an N-over-N-over-P-over-P (NNPP) four-transistor stack configuration that may be different than the first logic configuration. Various other stack configurations may be used, such as, e.g., PNPN and NPNP stack configurations, along with the other multi-transistor stack configurations, such as, e.g., as described herein above in reference to FIGS. 6A-6H and 7A-7F.

In some implementations, as shown in reference to FIGS. 7A-7F, the memory architecture described herein may refer to a device having a multi-transistor logic structure for use in memory architecture. The multi-transistor logic structure may include multiple P-type transistors that are arranged in one or more multi-transistor stacks. Also, the multi-transistor logic structure may include multiple N-type transistors that are arranged in the one or more multi-transistor stacks. Also, as described herein, the multi-transistor logic structure may refer to one or more of a header structure, a precharge structure, a read multiplexer structure, a write multiplexer structure, and a sense amplifier structure. Also, the multi-transistor logic structure includes a four-transistor logic structure arranged in the one or more multi-transistor stacks that are configured as one or more of a P-over-P-over-P-over-P (PPPP) multi-transistor stack, an N-over-N-over-N-over-N (NNNN) multi-transistor stack, a P-over-N-over-N-over-P (PNNP) multi-transistor stack, an N-over-P-over-P-over-N(NPPN) multi-transistor stack, a P-over-P-over-N-over-N (PPNN) multi-transistor stack, and/or an N-over-N-over-P-over-P (NNPP) multi-transistor stack.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with a multi-transistor logic structure for use in memory architecture. The multi-transistor logic structure may have a pair of P-type transistors that are arranged in a P-over-P multi-transistor stack.

Described herein are various implementations of a device with a multi-transistor logic structure for use in memory architecture. The multi-transistor logic structure may have a pair of N-type transistors that are arranged in an N-over-N multi-transistor stack.

Described herein are various implementations of a device with a multi-transistor logic structure for use in memory architecture. The multi-transistor logic structure may include multiple transistors that are arranged in a single multi-transistor stack used to increase strength of the device. The multiple transistors may include P-type transistors or N-type transistors arranged in the single multi-transistor stack with a common-gate that is used to increase the strength of the device by a factor of two or more.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
   a multi-transistor logic structure for use in memory architecture,
   wherein the multi-transistor logic structure includes first P-type transistors that are sequentially arranged in a first P-over-P-over-P-over-P multi-transistor stack, and
   wherein the multi-transistor logic structure includes second P-type transistors that are sequentially arranged in a second P-over-P-over-P-over-P multi-transistor stack.

2. The device of claim 1, wherein:
the multi-transistor logic structure refers to a header structure.

3. The device of claim 2, wherein: the header structure includes third P-type transistors and fourth P-type transistors that are arranged in a single stack with the third P-type transistors in a third P-over-P-over-P-over-P (PPPP) multi-transistor stack.

4. The device of claim 1, wherein:
the multi-transistor logic structure refers to a precharge structure.

5. The device of claim 1, wherein:
the multi-transistor logic structure refers to a read multiplexer structure.

6. The device of claim 1, wherein:
the multi-transistor logic structure refers to a write multiplexer structure for use in the memory architecture, and
the write multiplexer structure includes a pair of N-type transistors arranged in an N-over-N multi-transistor stack.

7. The device of claim 6, wherein:
the write multiplexer structure includes the pair of N-type transistors as a first pair of N-type transistors, and
the write multiplexer structure includes a second pair of N-type transistors that are arranged in a single stack with the first pair of N-type transistors in an N-over-N-over-N-over-N (NNNN) multi-transistor stack.

8. The device of claim 1, wherein:
the multi-transistor logic structure refers to a sense amplifier structure.

9. A device comprising:
a multi-transistor logic structure for use in memory architecture,
wherein the multi-transistor logic structure includes a pair of P-type transistors that are arranged in a P-over-P multi-transistor stack,
wherein the multi-transistor logic structure refers to a precharge structure that includes the pair of P-type transistors as a first pair of P-type transistors,
wherein the precharge structure includes a second pair of P-type transistors that are arranged in a first single stack with the first pair of P-type transistors in a first P-over-P-over-P-over-P (PPPP) multi-transistor stack,
wherein the precharge structure includes a third pair of P-type transistors and a fourth pair of P-type transistors that are arranged in a second single stack with the third pair of P-type transistors in a second P-over-P-over-P-over-P (PPPP) multi-transistor stack, and
wherein at least one of the pairs of P-type transistors in the first single stack or the second single stack are unused.

10. A device comprising:
a multi-transistor logic structure for use in memory architecture,
wherein the multi-transistor logic structure includes a pair of P-type transistors that are arranged in a P-over-P multi-transistor stack,
the multi-transistor logic structure refers to a sense amplifier structure that includes the pair of P-type transistors as a first pair of P-type transistors,
the sense amplifier structure includes a second pair of P-type transistors that are arranged in a first single stack with the first pair of P-type transistors in a first P-over-P-over-P-over-P (PPPP) multi-transistor stack,
wherein the sense amplifier structure includes a third pair of P-type transistors and a fourth pair of P-type transistors that are arranged in a second single stack with the third pair of P-type transistors in a second P-over-P-over-P-over-P (PPPP) multi-transistor stack, and
wherein at least three of the P-type transistors in the first single stack and the second single stack are unused.

11. A device comprising:
a multi-transistor logic structure for use in memory architecture,
wherein the multi-transistor logic structure includes a pair of P-type transistors that are arranged in a P-over-P multi-transistor stack,
wherein the multi-transistor logic structure refers to a sense amplifier structure that includes a first pair of N-type transistors,
wherein the sense amplifier structure includes a second pair of N-type transistors that are arranged in a single stack with the first pair of N-type transistors in an N-over-N-over-N-over-N (NNNN) multi-transistor stack, and
wherein at least one of the pairs of N-type transistors in the first pair of N-type transistors or the second pair of N-type transistors are unused.

12. A device comprising:
a multi-transistor logic structure for use in memory architecture,
wherein the multi-transistor logic structure includes a pair of N-type transistors that are sequentially arranged in an N-over-N multi-transistor stack,
wherein the multi-transistor logic structure includes first P-type transistors that are sequentially arranged in a first P-over-P-over-P-over-P multi-transistor stack, and
wherein the multi-transistor logic structure includes second P-type transistors that are sequentially arranged in a second P-over-P-over-P-over-P multi-transistor stack.

13. The device of claim 12, wherein:
the multi-transistor logic structure refers to a write multiplexer structure that includes the pair of N-type transistors as a first pair of N-type transistors, and
the write multiplexer structure includes a second pair of N-type transistors that are arranged in a single stack with the first pair of N-type transistors in an N-over-N-over-N-over-N (NNNN) multi-transistor stack.

14. The device of claim 12, wherein:
the multi-transistor logic structure refers to a read multiplexer structure.

15. A device comprising:
a multi-transistor logic structure for use in memory architecture,
wherein the multi-transistor logic structure includes a pair of N-type transistors that are arranged in an N-over-N multi-transistor stack,
wherein the multi-transistor logic structure refers to a header structure that includes a first stack of P-type transistors and a second stack of P-type transistors,
wherein the first stack of P-type transistors is arranged in a first P-over-P-over-P-over-P (PPPP) multi-transistor stack, and
wherein the second stack of P-type transistors is arranged in a second P-over-P-over-P-over-P (PPPP) multi-transistor stack.

16. A device comprising:
a multi-transistor logic structure for use in memory architecture,
wherein the multi-transistor logic structure includes a pair of N-type transistors that are arranged in an N-over-N multi-transistor stack, wherein the multi-transistor logic structure refers to a precharge structure that includes a first stack of P-type transistors and a second stack of P-type transistors, wherein the first stack of P-type transistors is arranged in a first P-over-P-over-P-over-P (PPPP) multi-transistor stack, wherein the second stack of P-type transistors is arranged in a second P-over-P-over-P-over-P (PPPP) multi-transistor stack, and wherein at least two of the P-type transistors in the first stack or the second stack are unused.

17. A device comprising:

a multi-transistor logic structure for use in memory architecture, wherein the multi-transistor logic structure includes a pair of N-type transistors that are arranged in an N-over-N multi-transistor stack, wherein the multi-transistor logic structure refers to a sense amplifier structure that includes the pair of N-type transistors as a first pair of N-type transistors, wherein the sense amplifier structure includes a second pair of N-type transistors that are arranged in a single stack with the first pair of N-type transistors in an N-over-N-over-N-over-N (NNNN) multi-transistor stack, and wherein at least one of the pairs of N-type transistors in the first pair of N-type transistors or the second pair of N-type transistors are unused.

18. A device comprising:

a multi-transistor logic structure for use in memory architecture, wherein the multi-transistor logic structure includes a pair of N-type transistors that are arranged in an N-over-N multi-transistor stack, wherein the multi-transistor logic structure refers to a sense amplifier structure that includes a first stack of P-type transistors and a second stack of P-type transistors, wherein the first stack of P-type transistors aro is arranged in a first P-over-P-over-P-over-P (PPPP) multi-transistor stack, wherein the second stack of P-type transistors a-re is arranged in a second P-over-P-over-P-over-P (PPPP) multi-transistor stack, and wherein at least three of the P-type transistors in the first single stack and the second single stack are unused.

19. A device comprising:

a multi-transistor logic structure for use in memory architecture, wherein the multi-transistor logic structure includes multiple pairs of transistors that are sequentially arranged in a single multi-transistor stack used to increase strength of the device, and wherein at least one of the multiple pairs of transistors in the single multi-transistor stack are unused.

20. The device of claim 19, wherein:

the multiple pairs of transistors include multiple pairs of P-type transistors or multiple pairs of N-type transistors arranged in the single multi-transistor stack with a common-gate that is used to increase the strength of the device by a factor of two or more.

* * * * *